United States Patent
Kouketsu et al.

(10) Patent No.: US 8,590,942 B2
(45) Date of Patent: Nov. 26, 2013

(54) CONNECTED STRUCTURE OF VACUUM DOUBLE PIPE, VACUUM DOUBLE PIPE, AND JOINT OF VACUUM DOUBLE PIPE

(75) Inventors: Masayuki Kouketsu, Komaki (JP); Hiroshi Itafuji, Komaki (JP); Shinji Hayakawa, Hokuto (JP); Yasushi Kohno, Hokuto (JP)

(73) Assignees: CKD Corporation, Komaki-shi, Aichi (JP); Mirapro Co., Ltd., Hokuto-shi, Yamanashi (JP)

( * ) Notice: Subject to any disclaimer, the term of this patent is extended or adjusted under 35 U.S.C. 154(b) by 109 days.

(21) Appl. No.: 13/073,744

(22) Filed: Mar. 28, 2011

(65) Prior Publication Data

US 2011/0233923 A1 Sep. 29, 2011

(30) Foreign Application Priority Data

Mar. 29, 2010 (JP) ................................ 2010-074342
Mar. 29, 2010 (JP) ................................ 2010-074343
Mar. 29, 2010 (JP) ................................ 2010-074344

(51) Int. Cl.
*F16L 7/00* (2006.01)

(52) U.S. Cl.
USPC ................ 285/123.3; 285/123.4; 285/123.12

(58) Field of Classification Search
USPC ............ 285/123.4, 123.3, 123.1, 123.12, 904
See application file for complete search history.

(56) References Cited

U.S. PATENT DOCUMENTS

| | | | | |
|---|---|---|---|---|
| 1,140,633 A * | 5/1915 | Trucano | ..................... | 285/123.1 |
| 3,068,026 A * | 12/1962 | McKamey | ................. | 285/123.1 |
| 3,195,564 A * | 7/1965 | Carney et al. | ................ | 285/904 |
| 3,213,889 A * | 10/1965 | Cotman, Jr. | ................ | 285/123.1 |
| 3,843,171 A * | 10/1974 | Hewlett | ........................ | 285/904 |
| 4,067,596 A * | 1/1978 | Kellner et al. | ............. | 285/123.3 |
| 4,922,971 A * | 5/1990 | Grantham | ................... | 285/123.1 |
| 5,011,193 A * | 4/1991 | Porte | ............................ | 285/123.1 |
| 5,018,260 A * | 5/1991 | Ziu | .............................. | 285/123.1 |
| 5,253,675 A * | 10/1993 | Ooshio et al. | ................ | 285/904 |
| 5,301,721 A * | 4/1994 | Hartmann | .................. | 285/123.1 |
| 5,681,063 A * | 10/1997 | Bressner | ..................... | 285/123.1 |
| 5,913,336 A * | 6/1999 | Ingram | ....................... | 285/123.3 |
| 6,076,862 A * | 6/2000 | Barth et al. | ................ | 285/123.1 |
| 6,848,720 B2 * | 2/2005 | Carns et al. | ................ | 285/123.3 |
| 6,866,299 B2 * | 3/2005 | Coates | ....................... | 285/123.1 |
| 6,971,682 B2 * | 12/2005 | Hoang et al. | ................ | 285/123.3 |
| 7,052,047 B1 * | 5/2006 | Box et al. | ...................... | 285/904 |
| 7,152,700 B2 * | 12/2006 | Church et al. | ............. | 285/123.3 |
| 7,399,002 B2 * | 7/2008 | Motew et al. | .............. | 285/123.3 |
| 7,584,764 B2 * | 9/2009 | Maldavs | ..................... | 285/123.1 |
| 8,074,687 B2 * | 12/2011 | Queau et al. | ................ | 285/123.1 |
| 8,231,143 B2 * | 7/2012 | Takasaki et al. | ........... | 285/123.3 |

FOREIGN PATENT DOCUMENTS

| | | |
|---|---|---|
| JP | 6-281087 | 10/1994 |
| JP | 10-132151 | 5/1998 |
| JP | 2000-213675 | 8/2000 |
| JP | 2005-207483 | 8/2005 |

* cited by examiner

*Primary Examiner* — David E Bochna
(74) *Attorney, Agent, or Firm* — Beyer Law Group LLP

(57) ABSTRACT

The connected structure includes a plurality of vacuum double pipes and a joint connecting the plurality of vacuum double pipes. Each vacuum double pipe includes an inner pipe and an outer pipe, and a vacuum passage is formed between the inner pipe and the outer pipe. The vacuum passage is open at both ends in an extension direction of the inner pipe and sealed between the both ends. The joint includes an inner pipe joint portion having inner pipe connectors and an outer pipe joint portion having outer pipe connectors. The joint evacuation passage connects the vacuum passages and is sealed between the outer pipe connectors.

17 Claims, 25 Drawing Sheets

CONNECTED STRUCTURE OF VACUUM DOUBLE PIPE, VACUUM DOUBLE PIPE, AND JOINT OF VACUUM DOUBLE PIPE

CROSS-REFERENCE TO RELATED APPLICATIONS

This application claims priorities of Japanese Patent Application No. 2010-74342, No. 2010-74343, and No. 2010-74344 filed on Mar. 29, 2010 which are hereby incorporated by reference.

BACKGROUND OF THE INVENTION

1. Field of the Invention

The present invention relates to a connecting structure for a vacuum double pipe that creates a vacuum between an inner pipe and an outer pipe, the vacuum double pipe, and a joint of the vacuum double pipe.

2. Description of the Related Art

In a conventional example of this type of connecting structure, a gap between an inner pipe and an outer pipe of a vacuum double pipe is sealed by flanges on either end to form an airtight space (see Japanese Patent Application Publication No. 2000-213675, for example). In the connecting structure described in Japanese Patent Application Publication No. 2000-213675, the flanges are disposed to face each other and connected by a ferrule clamp so as to connect respective inner pipes to each other, and a periphery of the inner pipe is sealed by packing on opposing surfaces of the flanges. A vacuum suction port is provided in the outer pipe, and by evacuating the airtight space between the inner pipe and the outer pipe into a vacuum through the vacuum suction port, the inner pipe and outer pipe are thermally insulated.

With the connecting structure described in Japanese Patent Application Publication No. 2000-213675, however, thermal conduction occurs between the inner pipe and the outer pipe via the flanges, and therefore a thermal insulation property between the inner pipe and the outer pipe deteriorates in a joint part including the flanges.

Further, in a vacuum double pipe described in Japanese Patent Application Publication No. 2000-213675, the space sandwiched between the inner pipe and the outer pipe is formed independently in each double pipe, and therefore evacuation must be performed on each double pipe individually. As a result, a large amount of labor is required to evacuate a plurality of vacuum double pipes to a vacuum.

SUMMARY OF THE INVENTION

Accordingly, an object of the present invention is to solve at least a part of the conventional problems described above with a connected structure for a vacuum double pipe, the vacuum double pipe, and a joint of the vacuum double pipe to reduce a deterioration of a thermal insulation property and an amount of labor required to vacuum the vacuum double pipe.

The above and other objects of the present invention are attained at least partly by the connected structure. the connected structure of vacuum double pipes, comprising: a plurality of vacuum double pipes, each of the plurality of vacuum double pipes including an inner pipe having a flow passage for flowing a fluid, and an outer pipe that covers the inner pipe to form a vacuum passage between the inner pipe and the outer pipe; and a joint configured to connect the plurality of vacuum double pipes. The vacuum passage is open at both end in an extension direction of the inner pipe and sealed between the both end. The joint includes: an inner pipe joint unit having inner pipe connectors, each of the inner pipe connectors being connected to each of the inner pipes for connecting the flow passages of the inner pipes, the inner pipe joint unit being sealed between the inner pipe connectors; and an outer pipe joint unit having an outer pipe connectors, each of the outer pipe connectors being connected to each of the outer pipes, the outer pipe joint unit forming a evacuation passage between the inner pipe and the outer pipe. The evacuation passage is sealed between the outer pipe connectors that connect the vacuum passages of the outer pipes.

According to this constitution, the inner pipe of the vacuum double pipe is covered by the outer pipe, and a vacuum is established between the inner pipe and the outer pipe. As a result, thermal insulation is obtained between the inner pipe and the outer pipe by the vacuum. Further, the plurality of vacuum double pipes are connected to each other by the joint such that the fluid can flow through the flow passages of the respective inner pipes via the joint.

Here, the flow passages of the respective inner pipes are connected to each other by the inner pipe joint portion having the inner pipe connecting portion that is connected to the respective inner pipes. The midway part of the inner pipe joint portion between the inner pipe connecting portions is tightly closed, and therefore the fluid flowing through the flow passages of the respective inner pipes can flow without leaking.

The outer pipe joint portion covers the inner pipe joint portion and includes the outer pipe connecting portion connected to the respective outer pipes. Further, the joint evacuation passage is formed by the space between the inner pipe joint portion and the outer pipe joint portion. The joint evacuation passage connects the respective evacuation passages of the vacuum double pipes to each other, and the midway part thereof between the outer pipe connecting portions is tightly closed.

Hence, by evacuating the evacuation passage of the vacuum double pipe into a vacuum, the joint evacuation passage communicating with the evacuation passage, or in other words the space between the inner pipe joint portion and the outer pipe joint portion, can be evacuated to a vacuum. As a result, thermal insulation between the inner pipe joint portion and the outer pipe joint portion can be improved, and deterioration of the thermal insulation property of the vacuum double pipe in the joint part can be suppressed.

Further, the joint evacuation passage connects the respective evacuation passages of the vacuum double pipes to each other, and therefore, by evacuating a single vacuum double pipe to a vacuum, a plurality of vacuum double pipes can be evacuated to a vacuum together through the joint evacuation passage. As a result, the labor required to evacuate the vacuum double pipe to a vacuum can be reduced.

Note that as long as the inner pipe connecting portion and the outer pipe connecting portion are provided in an identical number, the number thereof may be set as desired. For example, when two of each are provided, the joint can be formed in a rectilinear shape, and when three of each are provided, the joint can be formed in a "T" shape. Further, the vacuum double pipe may be any vacuum double pipe that includes an outer pipe covering an inner pipe such that a vacuum is formed between the inner pipe and the outer pipe, for example a double pipe portion (a fluid passage portion and a case covering the fluid passage portion, for example) of a valve unit for controlling a fluid flowing through the inner pipe. Incidentally, the vacuum state includes any pressure lower than atmospheric pressure.

These and other object, features, aspects and advantages of the present invention will become more apparent from the following detailed description of the preferred embodiments with the accompanying drawings.

DESCRIPTION OF THE PREFERRED EMBODIMENTS

An embodiment will be described below with reference to the drawings. This embodiment is realized as a temperature control system that circulates a heating medium around a work piece holder for holding and heating a work piece in a process chamber of a semiconductor manufacturing apparatus while varying the temperature of the heating medium.

Figure 1:
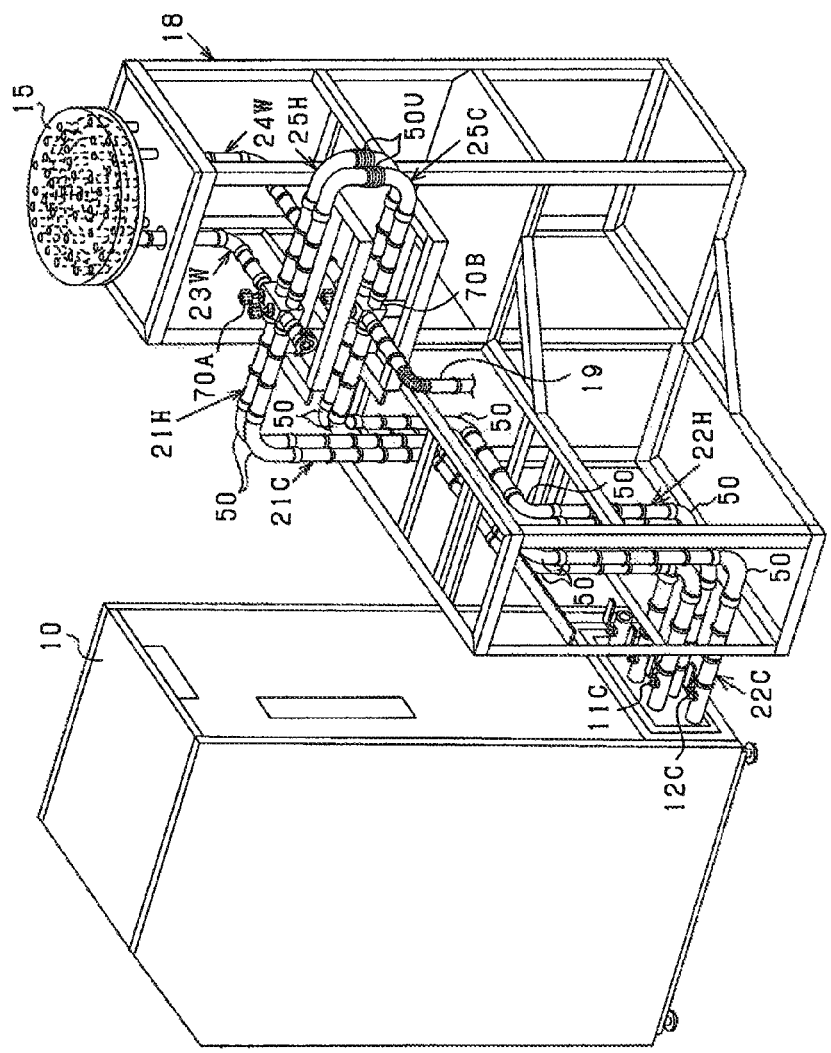
FIG. 1 is a perspective view showing the outer form of a temperature control system.

FIG. 1 is a perspective view showing an outer form of the temperature control system. Note that FIG. 1 shows parts of the semiconductor manufacturing apparatus relating to the temperature control system.

The temperature control system includes a supply unit 10, supply passages 21H, 21C, a supply side valve unit 70A, an introduction passage 23W, a work piece holder 15, a discharge passage 24W, a collection side valve unit 70B, and collection passages 22H, 22C, which are arranged in a Galden (a heating medium) flow direction. Further, the valve unit 70A and the valve unit 70B are connected by bypass passages 25H, 25C. A suction passage 19 of a vacuum pump is connected to the valve unit 70B.

Respective rectilinear pipes partially constituting the supply passages 21H, 21C, the introduction passage 23W, the discharge passage 24W, and the collection passages 22H, 22C are connected by an L shaped joint 50 and the valve units 70A, 70B. Respective rectilinear pipes partially constituting the bypass passages 25H, 25C are connected by a U shaped joint 50U.

The high temperature side supply passage 21H and the low temperature side supply passage 21C are disposed in series, or more specifically in parallel. Similarly, the high temperature side collection passage 22H and the low temperature side collection passage 22C are disposed in series, or more specifically in parallel. Further, the high temperature side bypass passage 25H and the low temperature side bypass passage 25C are disposed in series, or more specifically in parallel. Note that these passages, as well as the joints 50, 50U, the valve units 70A, 70B, and the work piece holder 15, are supported by a frame 18 assembled using angles or the like.

Figure 2:
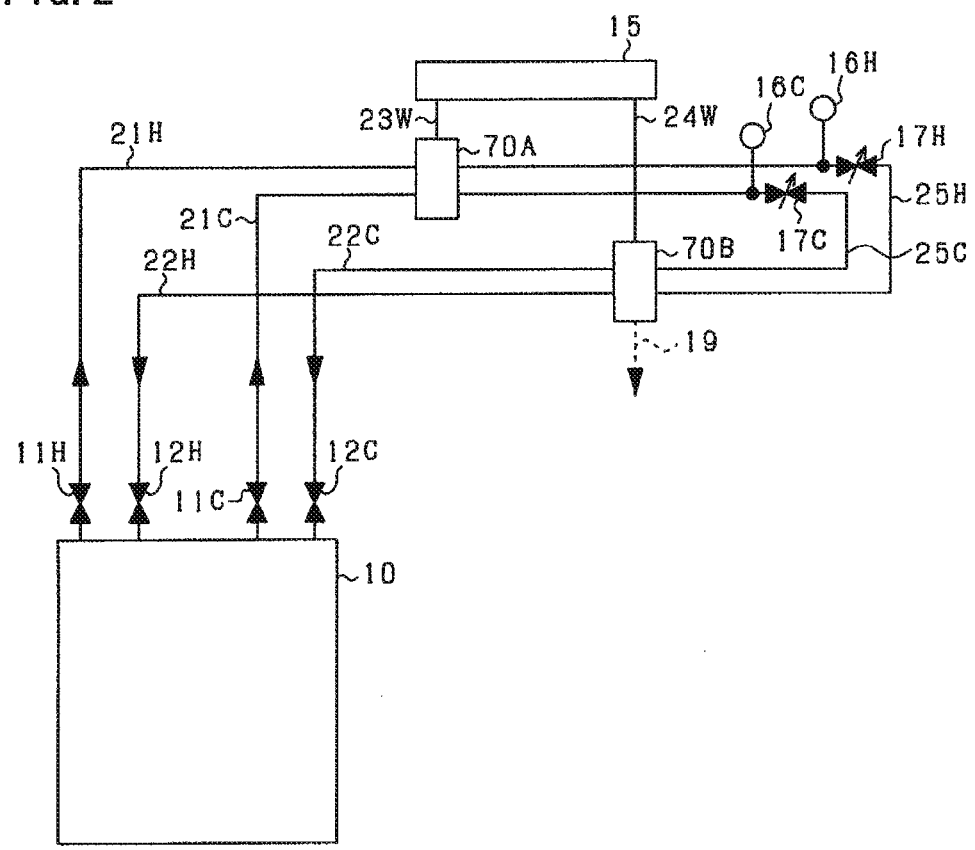
FIG. 2 is a circuit diagram of the temperature control system.

FIG. 2 is a circuit diagram showing a route along which the Galden flows in the temperature control system described above.

The supply unit 10 includes a high temperature side supply mechanism for supplying and collecting high temperature Galden and a low temperature side supply mechanism for supplying and collecting low temperature Galden. The high temperature side supply mechanism supplies Galden at 150° C. via a high temperature side open/close valve 11H. The low temperature side supply mechanism supplies Galden at 15° C. via a low temperature side open/close valve 11C. Note that the respective temperatures of the high temperature Galden and the low temperature Galden may be modified appropriately in accordance with the apparatus to which the system is applied.

The high temperature side supply passage 21H is connected to the high temperature side open/close valve 11H. The open/close valve 11H opens and closes the supply passage 21H. The supply passage 21H is connected to the high temperature side bypass passage 25H and the introduction passage 23W via the supply side valve unit 70A. The supply passage 21H and the bypass passage 25H communicate with each other at all times. The valve unit 70A switches the supply passage 21H and the introduction passage 23W between a communicative state and a blocked state.

Similarly, the low temperature side supply passage 21C is connected to the low temperature side open/close valve 11C. The open/close valve 11C opens and closes the supply passage 21C. The supply passage 21C is connected to the low temperature side bypass passage 25C and the introduction passage 23W via the supply side valve unit 70A. The supply passage 21C and the bypass passage 25C communicate with each other at all times. The valve unit 70A switches the supply passage 21C and the introduction passage 23W between a communicative state and a blocked state.

The introduction passage 23W is connected to an inlet of a holder interior passage provided in the work piece holder 15. The holder interior passage is formed in a double spiral shape such that the Galden flows through the interior of the work piece holder 15 without bias. An outlet of the holder interior passage is connected to the discharge passage 24W.

The discharge passage 24W is connected to the high temperature side collection passage 22H and the low temperature side collection passage 22C via the collection side valve unit 70B. The valve unit 70B switches the discharge passage 24W and the high temperature side collection passage 22H between a communicative state and a blocked state. Further, the valve unit 70B switches the discharge passage 24W and the low temperature side collection passage 22C between a communicative state and a blocked state.

The high temperature side bypass passage 25H is connected to the high temperature side collection passage 22H via the collection side valve unit 70B. The bypass passage 25H and the collection passage 22H communicate with each other at all times. Note that the bypass passage 25H is connected to the discharge passage 24W via the valve unit 70B.

Similarly, the low temperature side bypass passage 25C is connected to the low temperature side collection passage 22C via the collection side valve unit 70B. The bypass passage 25C and the collection passage 22C communicate with each other at all times. Note that the bypass passage 25C is connected to the discharge passage 24W via the valve unit 70B.

A high temperature side manometer 16H and a high temperature side throttle valve 17H are provided in the high temperature side bypass passage 25H. The manometer 16H detects the pressure of the Galden flowing through the bypass passage 25H. The throttle valve 17H adjusts the amount of Galden flowing through the bypass passage 25H by modifying a passage area of the bypass passage 25H. Similarly, a low temperature side manometer 16C and a low temperature side throttle valve 17C are provided in the low temperature side bypass passage 25C.

The high temperature side collection passage 22H is connected to a high temperature side open/close valve 12H. The open/close valve 12H opens and closes the collection passage 22H. The high temperature Galden is collected in the high temperature side supply mechanism via the open/close valve 12H.

Similarly, the low temperature side collection passage 22C is connected to a low temperature side open/close valve 12C. The open/close valve 12C opens and closes the collection passage 22C. The low temperature Galden is collected in the low temperature side supply mechanism via the open/close valve 12C.

Here, the supply passages 21H, 21C, the valve units 70A, 70B, the introduction passage 23W, the discharge passage 24W, the bypass passages 25H, 25C, and the collection passages 22H, 22C are respectively formed with a duplex structure. A gap part of the duplex structure can be evacuated to a vacuum.

More specifically, respective gap parts of the passages and the valve units 70A, 70B communicate with each other to form a continuous space. End portions of the continuous space are sealed, and therefore, apart from a suction part for evacuating the space into a vacuum, the continuous space is airtight. For example, the continuous space is sealed in a connecting portion between the introduction passage 23W and the work piece holder 15 and a connecting portion between the discharge passage 24W and the work piece holder 15.

A vacuum port is provided in the continuous space, and the continuous space is evacuated to a vacuum through the vacuum port. More specifically, a vacuum port is provided in the collection side valve unit 70B, and the suction passage 19 of the vacuum pump is connected to the vacuum port. Hence, by driving the vacuum pump, the continuous space is evacuated to a vacuum through the suction passage 19.

Note that the vacuum port may be provided in the supply side valve unit 70A instead of the collection side valve unit 70B. Alternatively, vacuum ports may be provided in both of the valve units 70A, 70B.

When the gap parts of the passages and the valve units 70A, 70B have been evacuated to a vacuum, or in other words when the passages and valve units 70A, 70B are thermally insulated, the high temperature Galden and the low temperature Galden are caused to flow to the work piece holder 15 alternately. Thus, the temperature of the work piece holder 15 is modified appropriately, and as a result, the temperature of the work piece held by the work piece holder 15 is controlled.

Next, a vacuum double pipe partially constituting the supply passages 21H, 21C, the introduction passage 23W, the discharge passage 24W, the bypass passages 25H, 25C, and the collection passages 22H, 22C will be described.

Figure 3:
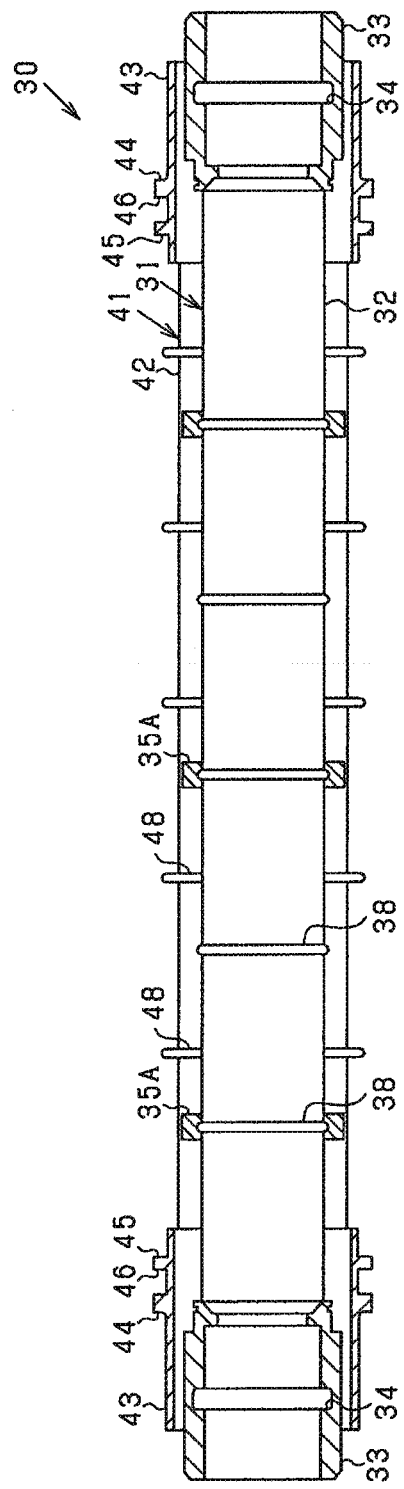
FIG. 3 is a sectional view of a vacuum double pipe.

FIG. 3 is a sectional view of a vacuum double pipe 30.

The vacuum double pipe 30 includes an inner pipe 31 through which the Galden flows and an outer pipe 41 covering the inner pipe 31. The inner pipe 31 and the outer pipe 41 are respectively formed in pipe shapes that extend rectilinearly and have a substantially equal length. An evacuation passage 37 is formed by a space between an outer surface of the inner pipe 31 and an inner surface of the outer pipe 41.

Respective end parts of the evacuation passage 37 are open in an extension direction (a lengthwise direction) of the inner pipe 31 and outer pipe 41. Thus, the respective evacuation passages 37 of two vacuum double pipes 30 can communicate with each other via evacuation passages formed in the interior of the joints 50, 50U.

In more detail, the inner pipe 31 and outer pipe 41 are both formed in a cylindrical shape such that the inner pipe 31 is slightly longer than the outer pipe 41. An inner diameter of the outer pipe 41 is larger than an outer diameter of the inner pipe 31.

Parts between the respective end portions of the inner pipe 31 and outer pipe 41 in an extension direction (an axial direction) thereof are tightly sealed. Hence, when the Galden is caused to flow through the interior of the inner pipe 31, the Galden can be prevented from leaking to the exterior of the inner pipe 31. Further, when the evacuation passage 37 has been evacuated to a vacuum, Galden leakage from the interior of the inner pipe 31 into the evacuation passage 37 and air infiltration from the exterior of the outer pipe 41 into the evacuation passage 37 can be prevented.

The inner pipe 31 includes an inner pipe main body 32, and end portions 33 provided at either end thereof. The inner pipe main body 32 and the end portions 33 are connected by welding.

Each end portion 33 is connected to an inside part of the joints 50, 50U having a duplex structure or an inside part of the valve units 70A, 70B having a duplex structure. An annular groove 34 to which an O ring (an inner pipe sealing member) can be fitted is provided on an inner surface of the end portion 33.

A pipe wall of the inner pipe main body 32 is formed to be thinner than a pipe wall of the end portion 33. More specifically, a thickness of the pipe wall of the inner pipe main body 32 is 0.15 mm, i.e. much thinner than the thickness (between approximately 1.0 and 1.5 mm) of a pipe wall of a conventional vacuum double pipe. Note that an outer diameter of the inner pipe main body 32 is substantially 20 mm.

The outer pipe 41 includes an outer pipe main body 42, and end portions 43 provided at either end thereof. The outer pipe main body 42 and the end portions 43 are connected by welding.

Each end portion 43 is connected to an outside part of the joints 50, 50U having a duplex structure or an outside part of the valve units 70A, 70B having a duplex structure. A step portion 44 is provided on an outer surface of the end portion 43 in an annular shape. The step portion 44 is formed with dimensions that allow the step portion 44 to press an O ring (an outer pipe sealing member) attached to an outer periphery of the end portion 43 in the extension direction of the outer pipe 41. Hence, when the O ring is attached to the outer periphery of the end portion 43, an outer diameter of the O ring substantially matches an outer diameter of the annular step portion 44.

Further, an annular groove 46 to which a latch ring can be fitted is provided in the outer surface of each end portion 43 of the outer pipe 41. The latch ring is a member for connecting the outside part of the joints 50, 50U and the outside part of the valve units 70A, 70B to the end portions 43 of the outer pipe 41.

More specifically, an annular step portion 45 is provided on each end portion 43 of the outer pipe 41 so as to be parallel to the aforesaid step portion 44 via an interval. The step portion 44 for pressing the O ring is provided further toward an end side of the outer pipe 41 than the step portion 45. The annular step portions 44, 45 have substantially identical outer diameters. A recessed portion sandwiched between the step portions 44, 45 serves as the groove 46 into which the latch ring is fitted.

A pipe wall of the outer pipe main body 42 is formed to be thinner than a pipe wall of the end portion 43. More specifically, a thickness of the pipe wall of the outer pipe main body 42 is set at 0.15 mm, similarly to the inner pipe main body 32 described above. Note that an outer diameter of the outer pipe main body 42 is substantially 28 mm.

Here, a plurality of annular node portions 38 are formed at intervals in the inner pipe main body 32 by bending the pipe wall thereof to project outwardly in a radial direction. Similarly, a plurality of annular node portions 48 are formed at intervals in the outer pipe main body 42 by bending the pipe wall thereof to project outwardly in the radial direction. An outer diameter of the node portion 38 of the inner pipe main body 32 is smaller than an inner diameter of the outer pipe main body 42. Therefore, gaps are formed between a ridge (a radial direction end portion) of the node portion 38 and the inner surface of the outer pipe main body 42.

The strength of the inner pipe main body 32 and the outer pipe main body 42 is improved by the node portions 38, 48. More specifically, a strength relative to a force exerted on the inner pipe main body 32 and outer pipe main body 42 in the radial direction can be improved. Hence, the strength required by the vacuum double pipe 30 can be secured in the inner pipe main body 32 and outer pipe main body 42 while dramatically reducing the thickness of the pipe wall in comparison with a conventional pipe. As a result, reductions can be achieved in the weight and thermal capacity of the inner pipe main body 32 and outer pipe main body 42.

In particular, in the vacuum double pipe 30, the outer pipe 41 covers the inner pipe 31, and therefore, if the pipe wall thickness is identical in the inner pipe 31 and the outer pipe 41, a volume of a member constituting the pipe wall of the outer pipe 41 is greater than a volume of a member constituting the pipe wall of the inner pipe 31. Therefore, by reducing the thickness of the pipe wall of the outer pipe 41, the vacuum double pipe 30 can be reduced in weight effectively.

More specifically, the strength of the inner pipe main body 32 and the outer pipe main body 42 improves steadily as the respective gaps between the node portions 38, 48 become smaller. Here, the inner pipe 31 expands and contracts as the temperature of the fluid flowing through the interior of the inner pipe 31 varies, but this expansion and contraction of the inner pipe 31 can be absorbed by the node portions 38 of the inner pipe main body 32. For this purpose, an expansion/contraction amount should be calculated on the basis of the temperature of the fluid and the material of the inner pipe 31, and the number of node portions 38 and the gaps between the node portions 38 should be set in accordance with the expansion/contraction amount.

Further, strength relative to a force exerted on the inner pipe main body 32 and outer pipe main body 42 in the radial direction improves steadily as a height of the node portions 38, 48 increases. Note that as the height of the node portions 38, 48 increases, the inner pipe main body 32 and outer pipe main body 42 are more likely to deform in response to a force exerted on the inner pipe main body 32 and outer pipe main body 42 in the extension direction (lengthwise direction) thereof.

In this embodiment, the gap between the node portions 38 of the inner pipe main body 32 and the gap between the node portions 48 of the outer pipe main body 42 are set to be substantially equal. The height of the node portions 38 is set to be smaller than the height of the node portions 48. More specifically, the height of the node portion 38 is substantially half the height of the node portion 48. Hence, the strength of the outer pipe main body 42 can be improved further by the node portions 48.

The inner pipe 31 and outer pipe 41 are formed from stainless steel, specifically austenite-based stainless steel, and more specifically SUS316L. The inner pipe main body 32 and the outer pipe main body 42 are manufactured according to a following method.

First, an SUS316L thin plate is rounded into a tubular shape, whereupon overlapping end portions are welded to each other. A force for causing the tubular member formed in this manner to contract in a lengthwise direction is then exerted on a lengthwise direction (axial direction) part thereof. As a result, a pipe wall of the part on which the force is exerted bends so as to project in an annular shape outwardly in the radial direction (an outer diameter direction).

The projecting part serves as the respective node portions 38, 48 of the inner pipe main body 32 and the outer pipe main body 42. By appropriately adjusting the magnitude of the force exerted on the tubular member in the lengthwise direction, the height of the node portions 38, 48 can be adjusted.

According to this manufacturing method, the gap between the node portions 38, the gap between the node portions 48, and the heights of the node portions 38, 48 can be set as desired. Note that these dimensions may be modified appropriately in accordance with the diameters of the inner pipe main body 32 and outer pipe main body 42, the pressure of the Galden flowing through the interior of the inner pipe 31, a degree of vacuum in the space (the evacuation passage 37) formed between the inner pipe 31 and the outer pipe 41, and so on.

A support ring 35A (support member) for supporting the inner pipe 31 and the outer pipe 41 relative to each other is mounted on an outer periphery of the inner pipe 31. The support ring 35A is formed from an adiabatic resin that is resistant to heat in a used temperature region of the Galden.

Figure 4A:
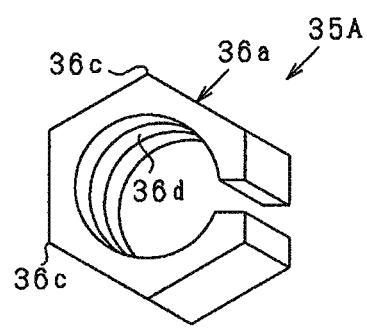
FIGS. 4A to 4D are perspective views of a support ring.

More specifically, as shown in FIG. 4A, the support ring 35A includes a support ring main body 36a formed in a "C" shape. Angle portions 36c (projecting portions) are provided at predetermined intervals on an outer surface of the support ring main body 36a. The support ring 35A has a hexagonal outer shape.

At the angle portion 36c, a ridge line extends in a central axis direction of the support ring main body 36a. Further, a groove 36d to which the node portion 38 of the inner pipe main body 32 can be fitted is provided in an inner surface of the support ring main body 36a.

As shown in FIG. 3, by widening the "C" shaped support ring 35A and then fitting a predetermined node portion 38 of the inner pipe main body 32 into the groove 36d in the support ring 35A, the support ring 35A is mounted on the outer periphery of the inner pipe main body 32. At this time, the angle portions 36c of the support ring 35A and the inner surface of the outer pipe main body 42 are in line contact. Accordingly, the inner pipe 31 and the outer pipe 41 are supported relative to each other in a state of line contact.

Figure 4B:
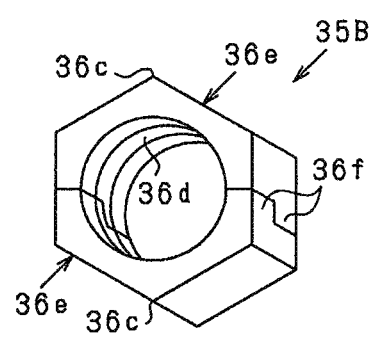

The support ring 35A may be modified to a support ring 35B shown in FIG. 4B. Note that parts common to the support ring 35A have been allocated identical reference symbols and description thereof has been omitted.

The support ring 35B includes two semi-annular support ring main bodies 36e. The support ring main bodies 36e are respectively provided with engagement portions 36f enabling the two support ring main bodies 36e to engage with each other. When the engagement portions 36f are engaged, the annular support ring 35B is constituted by the two support ring main bodies 36e. Thus, the support ring 35B can be mounted such that the inner pipe main body 32 is sandwiched from either side by the two support ring main bodies 36e.

Figure 4C:
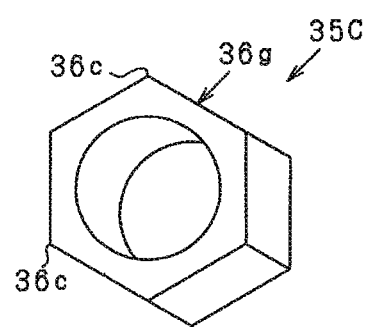

Further, in a case where the support ring 35A can be passed over the inner pipe 31 from the end portion 33, a support ring 35C shown in FIG. 4C may be used instead. Note that parts common to the support ring 35A have been allocated identical reference symbols and description thereof has been omitted.

The support ring 35C includes an annular support ring main body 36g. This type of support ring 35C can be employed when the outer diameter of the end portion 33 of the inner pipe 31 is equal to or smaller than the outer diameter of the inner pipe main body 32. The support ring 35C can be mounted by passing the support ring 35C over the inner pipe 31 from the end portion 33 and then adhering an inner surface of the support ring 35C to the outer surface of the inner pipe main body 32. At this time, passage of the support ring 35C may be obstructed by the node portions 38 of the inner pipe main body 32, but when the vacuum double pipe 30 is comparatively short in length, the support ring 35C may be provided only near the respective ends thereof.

Figure 4D:
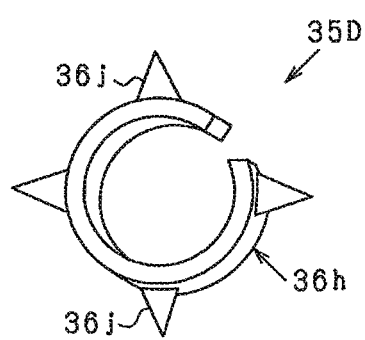

Further, the support ring 35A may be modified to a support ring 35D shown in FIG. 4D. According to the support ring 35D, the inner pipe 31 and the outer pipe 41 can be supported relative to each other in a state of point contact.

The support ring 35D includes a support ring main body 36h formed in a "C" shape. Projections 36j (projecting portions) are provided at predetermined intervals on an outer surface of the support ring main body 36h. The projections 36j extend from the outer surface of the support ring main body 36h in an outer diameter direction of the support ring main body 36h, and a tip end thereof is sharply pointed. Hence, when the support ring 35D is mounted on the outer periphery of the inner pipe main body 32, a state of point contact is established between the projections 36j of the support ring 35D and the inner surface of the outer pipe main body 42. With this constitution, thermal conduction between the support ring 35D and the outer pipe main body 42, and accordingly thermal conduction between the inner pipe main body 32 and the outer pipe main body 42, can be suppressed even further.

Next, the L shaped joint 50 constituting a part of the supply passages 21H, 21C, the introduction passage 23W, the discharge passage 24W, and the collection passages 22H, 22C will be described.

Figure 5:
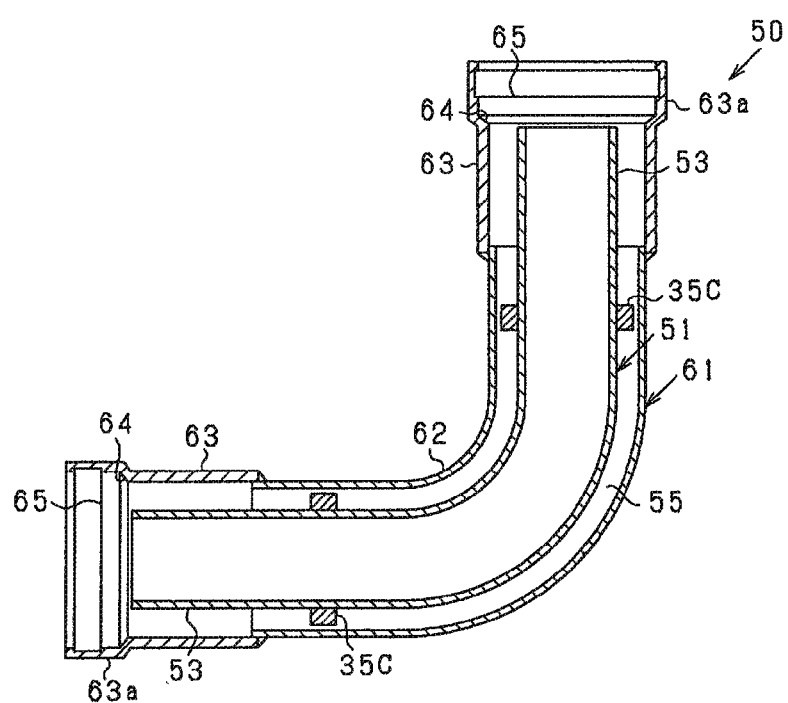
FIG. 5 is a sectional view of an L shaped joint.

FIG. 5 is a sectional view of the L shaped joint 50.

The L shaped joint 50 includes an inner pipe joint portion 51 for connecting the inner pipes 31 of respective vacuum double pipes 30 to each other, and an outer pipe joint portion 61 covering the inner pipe joint portion 51. The inner pipe joint portion 51 connects the interiors of the inner pipes 31, or in other words the Galden flow passages in the inner pipes 31, such that the Galden flows through the interior of the inner pipe joint portion 51. The inner pipe joint portion 51 and the outer pipe joint portion 61 are respectively formed in pipe shapes that extend in an "L" shape and have a substantially equal length. Note that the L shaped joint 50 may also be considered as a vacuum double pipe, and in this case, the inner pipe joint portion 51 and the outer pipe joint portion 61 correspond to the inner pipe and the outer pipe, respectively.

In more detail, the inner pipe joint portion 51 and the outer pipe joint portion 61 are both formed in a cylindrical shape such that the inner pipe joint portion 51 is slightly shorter than the outer pipe joint portion 61. An inner diameter of the outer pipe joint portion 61 is larger than an outer diameter of the inner pipe joint portion 51. As a result, a space is formed between an outer surface of the inner pipe joint portion 51 and an inner surface of the outer pipe joint portion 61, and this space serves as an evacuation passage 55 (a joint evacuation passage) used when the vacuum double pipe 30 and the joint 50 are evacuated to a vacuum.

Parts between the respective end portions of the inner pipe joint portion 51 and the outer pipe joint portion 61 in an extension direction (an axial direction) thereof are sealed. Hence, when the Galden is caused to flow through the interior of the inner pipe joint portion 51, the Galden can be prevented from leaking to the exterior of the inner pipe joint portion 51. Further, when the evacuation passage 55 of the joint 50 has been evacuated to a vacuum, Galden leakage from the interior of the inner pipe joint portion 51 into the evacuation passage 55 and air infiltration from the exterior of the outer pipe joint portion 61 into the evacuation passage 55 can be prevented.

Respective end portions of the evacuation passage 55 are open in the extension direction of the inner pipe joint portion 51 and outer pipe joint portion 61. Hence, when two vacuum double pipes 30 are connected via the joint 50, the respective spaces (evacuation passages 37) between the inner pipes 31 and the outer pipes 41 of the vacuum double pipes 30 can communicate with each other via the evacuation passage 55.

The inner pipe joint portion 51 is formed by bending a rectilinearly extending cylindrical pipe. For this purpose, the pipe wall of the inner pipe joint portion 51 is made thicker than the inner pipe main body 32 of the inner pipe 31 so that the inner pipe joint portion 51 can be bent. More specifically, a thickness of the pipe wall of the inner pipe joint portion 51 is set at substantially 0.5 mm, which is thinner than the pipe wall thickness of a conventional vacuum double pipe. The inner pipe joint portion 51, similarly to the inner pipe 31, is formed from SUS316L.

The inner pipe joint portion 51 is formed in an "L" shape, and therefore strength thereof relative to a radial direction force can be improved in comparison with a rectilinearly extending constitution. Further, the Galden is caused to flow through the interior of the inner pipe joint portion 51, while the exterior of the inner pipe joint portion 51 is evacuated to a vacuum. Hence, a force acts on the inner pipe joint portion from the inner surface to the outer surface. With a pipe-shaped member, strength for resisting this type of outwardly oriented force can be secured more easily than strength for resisting an inwardly oriented force.

Therefore, although the inner pipe joint portion 51 is not provided with a constitution corresponding to the node portions 38 provided in the inner pipe main body 32 of the inner pipe 31, the pipe wall of the inner pipe joint portion 51 is made thicker than that of the inner pipe main body 32, whereby the strength required of the L shaped joint 50 can be secured.

Respective end portions of the inner pipe joint portion 51 serve as inner pipe connecting portions 53 connected to the inner pipe 31 of the vacuum double pipe 30. An outer diameter of the inner pipe connecting portion 53 is set to be slightly smaller than the inner diameter of the end portion 33 of the inner pipe 31.

The outer pipe joint portion 61 includes an outer pipe joint portion main body 62, and outer pipe connecting portions 63 provided on either end thereof. Similarly to the inner pipe joint portion 51, the outer pipe joint portion main body 62 is formed by bending a rectilinearly extending cylindrical pipe. Similarly to the outer pipe 41, the outer pipe joint portion main body 62 is formed from SUS316L and a thickness of a pipe wall thereof is substantially 0.5 mm. Thus, the strength required by the L shaped joint 50 can also be secured in the outer pipe joint portion main body 62.

The outer pipe 41 of the vacuum double pipe 30 is connected to the outer pipe connecting portion 63. An inner diameter of the outer pipe connecting portion 63 is set to be slightly larger than the outer diameter of the end portion 43 of the outer pipe 41.

An annular step portion 64 is provided on an inner surface of the outer pipe connecting portion 63. An inner diameter of a part (an enlarged diameter part 63a) of the outer pipe connecting portion 63 further toward the end side than the step portion 64 is larger than an inner diameter of a part of an opposite side.

The step portion 64 is formed with dimensions that allow the step portion 64 to press the O ring attached to the outer periphery of the end portion 43 of the outer pipe 41, or in other words the O ring disposed on an inner periphery of the enlarged diameter part 63a of the outer pipe connecting portion 63, in an extension direction of the outer pipe connecting portion 63. Hence, when the O ring is attached to the outer periphery of the end portion 43 of the outer pipe 41, the outer diameter of the O ring substantially matches an inner diameter of the enlarged diameter part 63a.

Further, an annular groove 65 to which the aforesaid latch ring can be fitted is provided in an inner surface of the enlarged diameter part 63a of the outer pipe connecting portion 63. A cross-section of the groove 65 perpendicular to a circumferential direction is rectangular.

The support ring 35C (support member) for supporting the inner pipe joint portion 51 and the outer pipe joint portion 61 relative to each other is mounted on an outer periphery of the inner pipe joint portion 51. As described above, the support ring 35C is constituted as shown in FIG. 4C and formed from an adiabatic resin that is resistant to heat in the used temperature region of the Galden.

The inner diameter of the support ring 35C is substantially equal to the outer diameter of the inner pipe joint portion 51. The support ring 35C is passed from the inner pipe connecting portion 53 of the inner pipe joint portion 51 to a center side of the inner pipe joint portion 51. The inner surface of the support ring 35C is then adhered to the outer surface of the inner pipe joint portion 51.

The angle portions 36c of the support ring 35C and the inner surface of the outer pipe joint portion main body 62 are in line contact. Accordingly, the inner pipe joint portion 51 and the outer pipe joint portion 61 are supported relative to each other in a state of line contact.

Next, the U shaped joint 50U constituting a part of the bypass passages 25H, 25C will be described.

Figure 6:
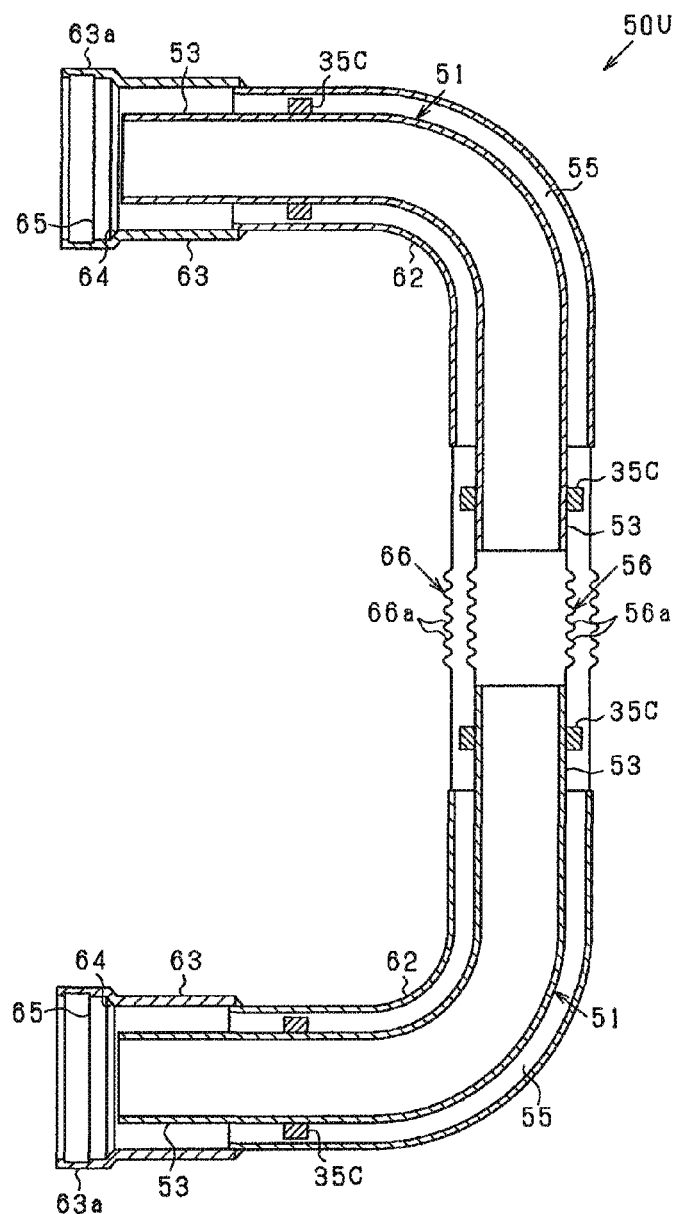
FIG. 6 is a sectional view of a U shaped joint.

FIG. 6 is a sectional view of the U shaped joint 50U formed in a U shape. The U shaped joint 50U is formed by inserting bellows portions 56, 66 into an intermediate part of the L shaped joint 50 described above. Accordingly, members shared with the L shaped joint 50 have been allocated identical reference symbols, and description thereof has been omitted.

The inner pipe connecting portion 53 and the outer pipe connecting portion 63 covering the inner pipe connecting portion 53 are provided respectively on each end of the U shaped joint 50U. The inner pipe joint portion 51 extends in an L shape from each inner pipe connecting portion 53, and the outer pipe joint portion main body 62 is connected to each outer pipe connecting portion 63 so as to extend in an L shape while covering the inner pipe joint portion 51. Thus, the inner pipe connecting portion 53, the outer pipe connecting portion 63, the inner pipe joint portion 51, and the outer pipe joint portion main body 62 are disposed in two symmetrical sets.

The two inner pipe joint portions 51 are connected by the inner pipe bellows portion 56, while the two outer pipe joint portion main bodies are connected by the outer pipe bellows portion 66. The bellows portions 56, 66 both extend in an overall rectilinear shape. The outer pipe bellows portion 66 covers the inner pipe bellows portion 56. A space is formed between an outer surface of the inner pipe bellows portion 56 and an inner surface of the outer pipe bellows portion 66. Note that the U shaped joint 50U may also be considered as a vacuum double pipe, and in this case, the inner pipe joint portion 51 and the inner pipe bellows portion 56 correspond to the inner pipe, while the outer pipe joint portion main body 62 and the outer pipe bellows portion 66 correspond to the outer pipe.

Similarly to the inner pipe main body 32 and outer pipe main body 42 of the vacuum double pipe 30, the bellows portions 56, 66 are formed from SUS316L. A thickness of a pipe wall of the bellows portions 56, 66 is 0.15 mm.

The bellows portion 56 includes a plurality of node portions 56a formed continuously. The bellows portion 66 includes a plurality of node portions 66a formed continuously. These node portions 56a, 66a are formed using a similar method to the node portions 38 of the inner pipe 31 and the node portions 48 of the outer pipe 41. Hence, a strength required by the U shaped joint 50U can be secured in the bellows portions 56, 66 while dramatically reducing the thickness of the pipe wall in comparison with a conventional joint.

The support ring 35C described above is disposed on an inner periphery of either end portion of the outer pipe bellows portion 66. The support ring 35C is provided on the outer periphery of the inner pipe connecting portion 53 of the inner pipe joint portion 51. The angle portions 36c of the support ring 35C and an inner surface of the end portion of the outer pipe bellows portion 66 are in line contact. Accordingly, the inner pipe joint portion 51 and the outer pipe bellows portion 66 are supported relative to each other in a state of line contact.

The inner pipe bellows portion 56, the outer pipe bellows portion 66 and the support ring 35C are assembled in a following sequence.

First, the support ring 35C is mounted on the outer periphery of each of the two inner pipe connecting portions 53 disposed to face each other, whereupon the inner pipe bellows portion 56 is connected to one of the inner pipe connecting portions 53 by welding. The outer pipe bellows portion 66 is then connected by welding to the end portion of one of the outer pipe joint portion main bodies 62 so as to cover the connected inner pipe bellows portion 56.

By causing the inner pipe bellows portion 56 to expand and causing the outer pipe bellows portion 66 to contract, an end portion on the side where the inner pipe bellows portion 56 is not connected is exposed from the interior of the outer pipe bellows portion 66. The other inner pipe connecting portion 53 is then connected by welding to the exposed end portion of the inner pipe bellows portion 56. The outer pipe bellows portion 66 is then connected by welding to the end portion of the other outer pipe joint portion main body 62 so as to cover the connected inner pipe bellows portion 56.

The respective outer pipe connecting portions 63 of the L shaped joint 50 and the U shaped joint 50U are provided with a manipulating portion with which the aforesaid latch ring can be manipulated.

Figure 7:
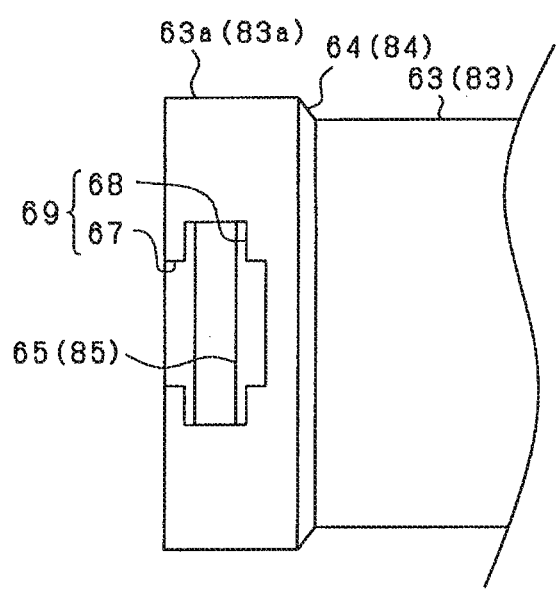
FIG. 7 is a front view of a manipulating portion.

FIG. 7 is a front view of the manipulating portion. A manipulating portion 69 is provided in the enlarged diameter part 63a of the outer pipe connecting portion 63. The manipulating portion 69 includes an insertion portion 67 and a peeping portion 68 (a visual confirmation portion).

A pick portion of the latch ring can be inserted into the insertion portion 67, which is formed as a notch in the end portion of the enlarged diameter part 63a. More specifically, the insertion portion 67 is formed in the extension direction of the outer pipe connecting portion 63 by cutting away a rectangular part of the enlarged diameter part 63a from an end side of the outer pipe connecting portion 63. A width of the insertion portion 67 in a circumferential direction of the enlarged diameter part 63a is set to be slightly greater than a width occupied by the pick portion of the latch ring.

The peeping portion 68 is formed by partially widening the insertion portion 67 in the circumferential direction of the enlarged diameter part 63a. In more detail, rectangular parts of the insertion portion 67 in an extension direction of the outer pipe connecting portion 63 are respectively enlarged in the circumferential direction of the enlarged diameter part 63a. This enlarged part serves as the peeping portion 68. A width of the peeping portion 68 in the extension direction of the outer pipe connecting portion 63 is set to be slightly greater than a width of the aforesaid groove 65 provided in the enlarged diameter part 63a. Hence, the state of the latch ring fitted into the groove 65 can be confirmed through the peeping portion 68.

Figure 8:
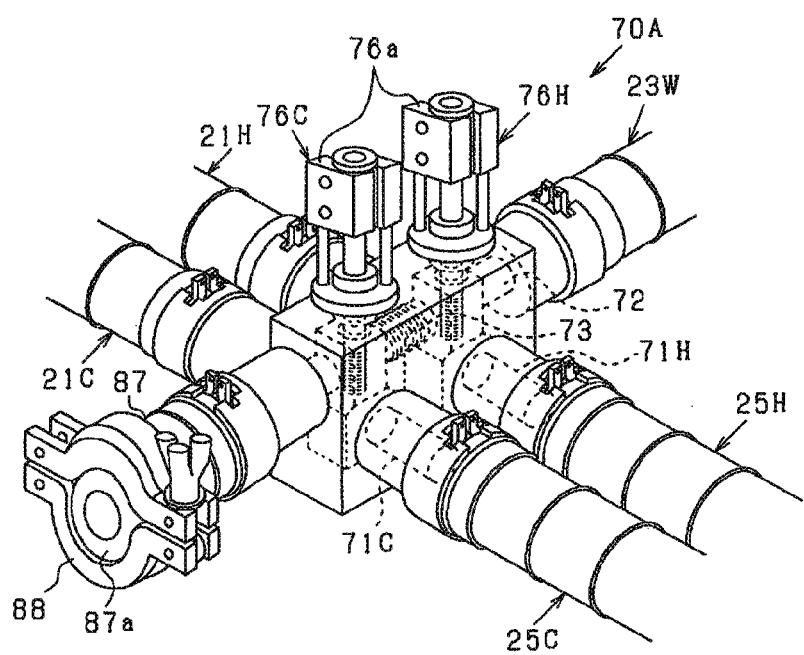
FIG. 8 is a perspective view of a valve unit and a periphery thereof.

FIG. 8 is a perspective view of the valve unit 70A and the periphery thereof.

The high temperature side supply passage 21H and the high temperature side bypass passage 25H are connected via the supply side valve unit 70A. The supply passage 21H and the bypass passage 25H are disposed collinearly. Similarly, the low temperature side supply passage 21C and the low temperature side bypass passage 25C are connected via the valve unit 70A, and the supply passage 21C and the bypass passage 25C are disposed collinearly.

Further, the introduction passage 23W and a preparatory passage 87 are connected via the valve unit 70A. The introduction passage 23W and the preparatory passage 87 are disposed collinearly.

The high temperature side supply passage 21H and high temperature side bypass passage 25H are skewed relative to the introduction passage 23W and preparatory passage 87. Similarly, the low temperature side supply passage 21C and low temperature side bypass passage 25C are skewed relative to the introduction passage 23W and preparatory passage 87.

Likewise in the collection side valve unit 70B, the collection passage 22H and bypass passage 25H are skewed relative to the discharge passage 24W, and similarly, the collection passage 22C and bypass passage 25C are skewed relative to the discharge passage 24W.

The preparatory passage 87 has a similar constitution to the vacuum double pipe 30 described above. Respective end portions of an inner pipe and an outer pipe of the preparatory passage 87 are sealed by a sealing flange 87a. The sealing flange 87a is attached to the end portions of the preparatory passage 87 by an attachment fitting 88. Note that a vacuum gauge may be provided instead of the sealing flange 87a. In this case, the vacuum gauge should be disposed such that the inner pipe of the preparatory passage 87 is sealed and such that a detection portion thereof is provided in a space (an evacuation passage) between the inner pipe and the outer pipe.

The valve unit 70A includes valves 76H, 76C. Driving portions 76a for driving respective valve bodies are provided on upper portions of the valves 76H, 76C. The driving portion 76a includes a cylinder and a piston (a driving member), and uses compressed air that is introduced into the cylinder from the outside and discharged from the cylinder to the outside to cause the piston to reciprocate. As a result, the valve body, which is coupled to the piston, is driven to reciprocate.

Figure 9:
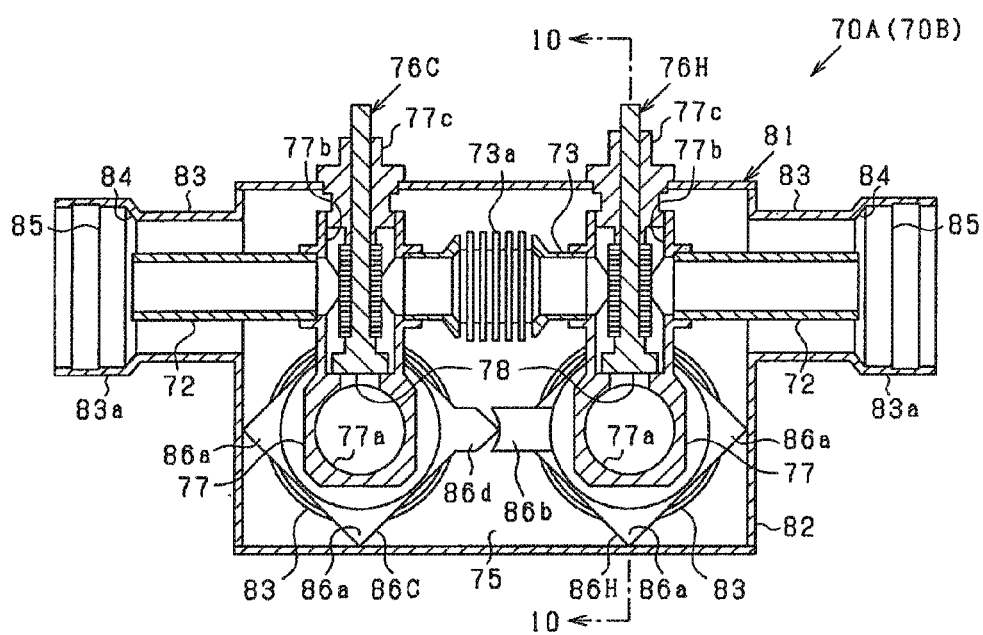
FIG. 9 is a sectional view showing the valve unit from a front surface direction.
Figure 10:
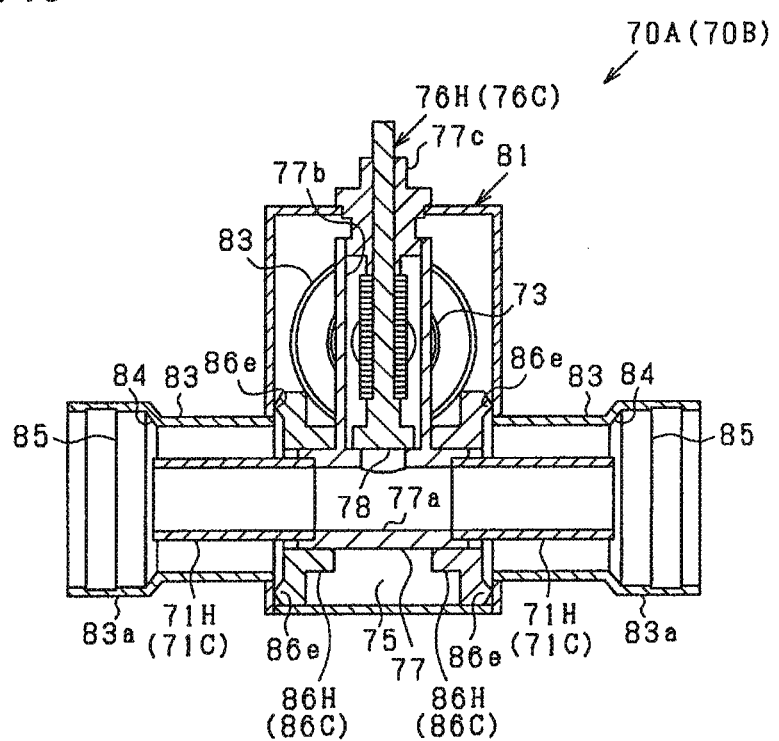
FIG. 10 is a sectional view taken along a 10-10 line in FIG. 9.

FIG. 9 is a sectional view showing the valve unit from a front surface direction. FIG. 10 is a sectional view taken along a 10-10 line in FIG. 9.

The valve unit 70A (70B) includes the high temperature side valve 76H and the low temperature side valve 76C. The valve 76H and the valve 76C are disposed in series such that orientations thereof are aligned. The valves 76H, 76C respectively include a valve main body 77 and a valve body 78.

The valve main body 77 includes, in its interior, a first main body passage 77a and a second main body passage 77b through which the Galden flows. The first main body passage 77a is formed in a rectilinear shape, and both ends thereof are open. An intermediate part of the first main body passage 77a communicates with the second main body passage 77b. The second main body passage 77b is formed in a rectilinear shape, and one end portion thereof is orthogonal to the first main body passage 77a. A guide portion 77c is provided on another end portion of the second main body passage 77b. An intermediate part of the second main body passage 77b is open in two opposing locations.

The valve body 78 is driven to reciprocate by a driving force exerted thereon by the piston. Thus, a communication portion between the first main body passage 77a and the second main body passage 77b is switched between a communicative state and a blocked state. The valve body 78 is supported to be capable of sliding by the aforesaid guide portion 77c.

A high temperature side first fluid passage portion 71H is connected to each end portion of the first main body passage 77a in the high temperature side valve 76H. In other words, two first fluid passage portions 71H are connected via the first main body passage 77a. The first fluid passage portion 71H is formed in a cylindrical shape so as to extend rectilinearly. The first main body passage 77a and the first fluid passage portions 71H are disposed collinearly.

Similarly, a low temperature side first fluid passage portion 71C is connected to each end portion of the first main body passage 77a in the low temperature side valve 76C. In other words, two first fluid passage portions 71C are connected via the first main body passage 77a. The first fluid passage portion 71C is formed in a cylindrical shape so as to extend rectilinearly. The first main body passage 77a and the first fluid passage portions 71C are disposed collinearly.

A second fluid passage portion 72 is connected to one opening portion of the second main body passage 77b in the high temperature side valve 76H, and a connecting passage portion 73 is connected to another opening portion. In other words, the second fluid passage portion 72 and the connecting passage portion 73 are connected via the second main body passage 77b. Similarly, the second fluid passage portion 72 is connected to one opening portion of the second main body passage 77b in the low temperature side valve 76C, and the connecting passage portion 73 is connected to another opening portion. In other words, the second fluid passage portion 72 and the connecting passage portion 73 are connected via the second main body passage 77b.

In the valve main body 77, a passage wall of the second main body passage 77b is formed to be thinner than a passage wall of the first main body passage 77a. As a result, thermal conduction between the first main body passage 77a and the connecting passage portion 73, and therefore thermal conduction between the high temperature side valve 76H and the low temperature side valve 76C, can be suppressed. Further, the thermal capacity of the second main body passage 77b can be reduced, and therefore heat loss in the fluid flowing through the interior of the second main body passage 77b can be suppressed when the temperature of the fluid is modified.

The connecting passage portion 73 is shared by the valves 76H, 76C, and connects the respective valve main bodies 77 to each other. The connecting passage portion 73 is formed in a cylindrical shape so as to extend rectilinearly. The second fluid passage portion 72 of the high temperature side valve 76H, the second fluid passage portion 72 of the low temperature side valve 76C, and the connecting passage portion 73 are disposed collinearly.

A bellows portion 73a is provided in an intermediate part of the connecting passage portion 73. Hence, even when the second fluid passage portion 72 and the connecting passage portion 73 expand and contract due to temperature variation therein, the expansion and contraction can be absorbed by the bellows portion 73a.

In the connecting passage portion 73, a pipe wall of the bellows portion 73a is formed to be thinner than a pipe wall of another part. However, strength is secured by node portions of the bellows portion 73a. Hence, thermal conduction between the high temperature side valve 76H and the low temperature side valve 76C can be suppressed. Further, the thermal capacity of the connecting passage portion 73 can be reduced, and therefore heat loss in the fluid flowing through the interior of the connecting passage portion 73 can be suppressed when the temperature of the fluid is modified.

With respect to the high temperature side valve 76H, the first main body passage 77a and first fluid passage portion 71H are skewed relative to the second fluid passage portion 72 and connecting passage portion 73, and these skewed members are connected by the second main body passage 77b. Similarly, with respect to the low temperature side valve 76C, the first main body passage 77a and first fluid passage portion 71C are skewed relative to the second fluid passage portion 72 and connecting passage portion 73, and these skewed members are connected by the second main body passage 77b.

The first main body passage 77a and first fluid passage portion 71H of the high temperature side valve 76H and the first main body passage 77a and first fluid passage portion 71C of the low temperature side valve 76C are disposed in series, or more specifically in parallel.

Further, the valve unit 70A includes a valve case 81. With respect to the high temperature side valve 76H, the valve case 81 covers the valve main body 77, the first fluid passage portion 71H, the second fluid passage portion 72, and the connecting passage portion 73. Similarly, with respect to the low temperature side valve 76C, the valve case 81 covers the valve main body 77, the first fluid passage portion 71C, the second fluid passage portion 72, and the connecting passage portion 73. Note that the valve unit 70A (70B) may also be considered as a vacuum double pipe, and in this case, the valve main body 77, first fluid passage portion 71H, second fluid passage portion 72, and connecting passage portion 73 correspond to the inner pipe while the valve case 81 corresponds to the outer pipe.

The valve case 81 includes a valve case main body 82 and four outer pipe connecting portions 83.

The valve case main body 82 is formed in the shape of a rectangular parallelepiped that mainly covers the respective valve main bodies 77 of the valves 76H, 76C and the connecting passage portion 73. The high temperature side first fluid passage portion 71H, low temperature side first fluid passage portion 71C, and second fluid passage portion 72 are respectively covered by the outer pipe connecting portions 83.

As shown in FIG. 7, the outer pipe connecting portion 83 is constituted similarly to the outer pipe connecting portion 63. In other words, the outer pipe connecting portion 83 includes an enlarged diameter part 83a, a step portion 84, a groove 85, an insertion portion 67, a peeping portion 68, and a manipulating portion 69, which correspond respectively to the enlarged diameter portion 63a, the step portion 64, the groove 65, the insertion portion 67, the peeping portion 68, and the manipulating portion 69.

Returning to FIGS. 9 and 10, in the valve case 81, a midway part between the enlarged diameter parts 83a of the outer pipe connecting portion 83 is tightly closed. In other words, the valve case 81 is open only at respective end portions of the outer pipe connecting portion 83.

A space is formed between an outer surface of the valves 76H, 76C and the connecting passage portion 73 and an inner surface of the valve case 81, or more specifically an inner surface of the valve case main body 82. Further, a space is formed between an outer surface of the first fluid passage portions 71H, 71C and the second fluid passage portion 72 and the inner surface of the valve case 81. An evacuation passage 75 is formed by these spaces.

The evacuation passage 75 communicates with the entire interior of the valve case 81. The evacuation passage 75 is open at the respective end portions of the first fluid passage portions 71H, 71C in the interior of each outer pipe connecting portion 83. Further, the evacuation passage 75 is open at the respective end portions of the second fluid passage portion 72 in the interior of each outer pipe connecting portion 83.

Hence, when two vacuum double pipes 30 are connected via the valve units 70A, 70B, the respective spaces (evacuation passages 37) between the inner pipes 31 and the outer pipes 41 of the vacuum double pipes 30 can be connected through the evacuation passage 75.

In the evacuation passage 75, a midway part between the opening portions is tightly closed. Hence, when the evacuation passage 75 is evacuated to a vacuum, Galden leakage from the respective passage portions and the valves 76H, 76C into the evacuation passage 75 and air infiltration from the exterior of the valve case 81 into the evacuation passage 75 can be prevented.

The valve unit 70A includes two sets of the high temperature side first fluid passage portion 71H and the outer pipe connecting portion 83 covering the first fluid passage portion 71H. The vacuum double pipe 30 constituting the high temperature side supply passage 21H is connected to one of these sets, and the vacuum double pipe 30 constituting the high temperature side bypass passage 25H is connected to the other set.

Similarly, the valve unit 70A includes two sets of the low temperature side first fluid passage portion 71C and the outer pipe connecting portion 83 covering the first fluid passage portion 71C. The vacuum double pipe 30 constituting the low temperature side supply passage 21C is connected to one of these sets, and the vacuum double pipe 30 constituting the low temperature side bypass passage 25C is connected to the other set.

Note that the set connected to the high temperature side supply passage 21H is parallel with the set connected to the low temperature side supply passage 21C, and the set connected to the high temperature side bypass passage 25H is parallel with the set connected to the low temperature side bypass passage 25C.

Further, the valve unit 70A includes two sets of the second fluid passage portion 72 and the outer pipe connecting portion 83 covering the second fluid passage portion 72. The vacuum double pipe 30 constituting the introduction passage 23W is connected to one of these sets, and the vacuum double pipe 30 constituting the preparatory passage 87 is connected to the other set.

Meanwhile, in the collection side valve unit 70B, the high temperature side collection passage 22H is connected in place of the high temperature side supply passage 21H and the low temperature side collection passage 22C is connected in place of the low temperature side supply passage 21C. Further, the discharge passage 24W is connected in place of the introduction passage 23W, and the suction passage 19 is connected in place of the preparatory passage 87. The bypass passages 25H, 25C are connected similarly to the supply side valve unit 70A.

Support pieces 86H, 86C (support members) for supporting the respective valve main bodies 77 of the valves 76H, 76C relative to the valve case main body 82 are mounted respectively on outer peripheries of the valve main bodies 77. The support pieces 86H, 86C are formed from an adiabatic resin that is resistant to heat in the used temperature region of the Galden.

More specifically, a through hole that engages with the outer periphery of the corresponding valve main body 77 is formed in each of the support pieces 86H, 86C. Angle portions 86a and 86e projecting in mutually orthogonal directions are provided on the support pieces 86H, 86C. A ridge line of the angle portion 86a is orthogonal to a ridge line of the angle portion 86e.

By engaging the through holes in the support pieces 86H, 86C with the outer peripheries of the respective valve main bodies 77, the support pieces 86H, 86C are mounted on the valve main bodies 77. In this state, inner surfaces of the support pieces 86H, 86C are adhered to the outer surfaces of the respective valve main bodies 77.

At this time, the angle portions 86a and 86e are respectively in line contact with mutually orthogonal planar portions of the valve case 81 (more specifically, the valve case main body 82). In other words, the valve case 81 is supported in a state of line contact by the angle portions 86a and 86e of the support pieces 86H, 86C. As a result, the valve main body 77 and the valve case 81 are supported relative to each other in a state of line contact.

Further, the low temperature side support piece 86C includes an angle portion 86d that projects in the direction of the high temperature side support piece 86H when the support pieces 86H, 86C are attached to the respective valve main bodies 77. Accordingly, the high temperature side support piece 86H includes a reception portion 86b for receiving the angle portion 86d of the low temperature side support piece 86C. Thus, the angle portion 86d of the low temperature side support piece 86C is in line contact with the reception portion 86b of the high temperature side support piece 86H.

As a result, the valve main body 77 of the high temperature side valve 76H and the valve main body 77 of the low temperature side valve 76C are supported in a state of mutual line contact. Therefore, even when the high temperature side valve 76H and the low temperature side valve 76C are both housed in the single valve case 81, the valves 76H, 76C can be supported relative to the valve case 81 while suppressing thermal conduction therebetween.

Figure 11:
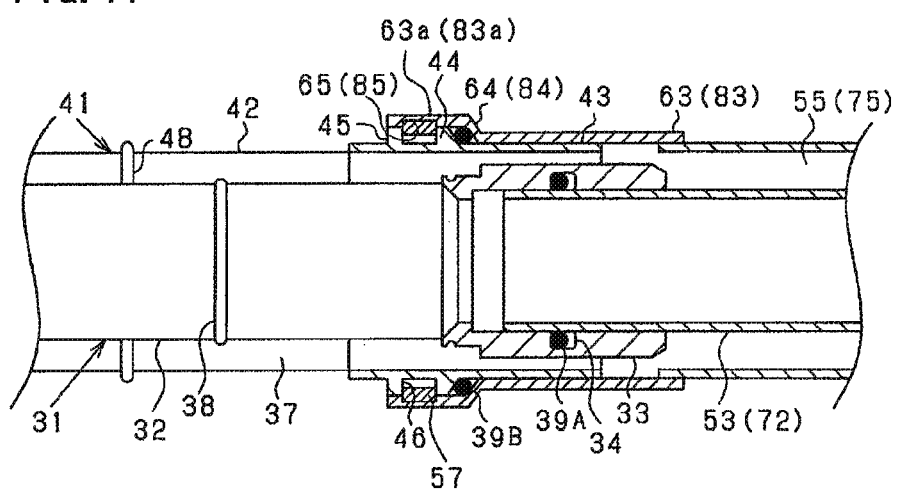
FIG. 11 is a sectional view showing a connection state of the vacuum double pipe.

FIG. 11 is a sectional view showing a connection between the vacuum double pipe 30 and the joint 50, 50U (the valve unit 70A, 70B). More specifically, FIG. 11 shows a connection between the end portion 33 of the inner pipe 31 of the vacuum double pipe 30 and the inner pipe connecting portion 53 (the connecting portion of the second fluid passage portion 72) of the joint 50, 50U (the valve unit 70A, 70B). FIG. 11 also shows a connection between the end portion 43 of the outer pipe 41 of the vacuum double pipe 30 and the outer pipe connecting portion 63 (83) of the joint 50, 50U (the valve unit 70A, 70B).

By connecting the vacuum double pipe 30 to the joint 50, 50U (the valve unit 70A, 70B), the space (the evacuation passage 37) between the inner pipe 31 and the outer pipe 41 of the vacuum double pipe 30 communicates with the evacuation passage 55 (75) of the joint 50, 50U (the valve unit 70A, 70B). Hence, when respective vacuum double pipes 30 are connected by the joint 50, 50U (the valve unit 70A, 70B), the evacuation passages 37 of the vacuum double pipes 30 communicate with each other.

The evacuation passage 37, 55 (75) is sealed using a following sealing structure. Here, the L shaped joint 50 will be described as an example.

An inner pipe sealing structure includes an O ring 39A (an inner pipe sealing member) for providing a seal between the end portion 33 of the inner pipe 31 and the inner pipe connecting portion 53 of the L shaped joint 50.

More specifically, the O ring 39A engages with the groove 34 provided in the end portion 33 of the inner pipe 31. The inner pipe connecting portion 53 of the L shaped joint 50 is inserted into the end portion 33 of the inner pipe 31 in the axial direction (lengthwise direction) of the inner pipe 31. Hence, in the inner pipe sealing structure, the inner surface of the end portion 33 of the inner pipe 31, or more specifically a bottom surface of the groove 34, and the outer surface of the inner pipe connecting portion 53 of the L shaped joint 50 are sealed in a radial direction of the inner pipe 31 by the O ring 39A.

Further, an outer pipe sealing structure includes an O ring 39B (an outer pipe sealing member) for providing a seal between the end portion 43 of the outer pipe 41 and the outer pipe connecting portion 63 of the L shaped joint 50.

More specifically, the O ring 39B is provided on the outer periphery of the end portion 43 of the outer pipe 41, or in other words the inner periphery of the enlarged diameter part 63a of the outer pipe connecting portion 63. The O ring 39B is provided between the step portion 44 provided on the end portion 43 of the outer pipe 41 and the step portion 64 of the outer pipe connecting portion 63 with respect to the extension direction (lengthwise direction) of the outer pipe 41, and is pressed by these step portions 44, 64. Hence, in the outer pipe sealing structure, the outer surface of the end portion 43 of the outer pipe 41, or more specifically a front surface of the step portion 44, and the inner surface of the outer pipe connecting portion 63, or more specifically a front surface of the step portion 64, are sealed in the extension direction of the outer pipe 41 by the O ring 39B.

The outer pipe 41 and the outer pipe connecting portion 63 (83) of the vacuum double pipe 30 are connected by a following outer pipe connectors. Here, as above, the L shaped joint 50 will be described as an example.

The outer pipe connectors includes a latch ring 57 (a connecting member) that connects the end portion 43 of the outer pipe 41 to the outer pipe connecting portion 63, or more specifically the enlarged diameter part 63a, of the L shaped joint 50 detachably. The latch ring 57 engages with both the groove 46 provided in the end portion 43 of the outer pipe 41 and the groove 65 provided in the enlarged diameter part 63a of the outer pipe connecting portion 63.

Hence, in the outer pipe connectors, the connection between the end portion 43 of the outer pipe 41 and the enlarged diameter part 63a of the outer pipe connecting portion 63 is maintained by the latch ring 57. In this state, the O ring 39B is pressed by the step portions 44, 64 such that the O ring 39B is deformed by a predetermined amount.

Figure 12A:
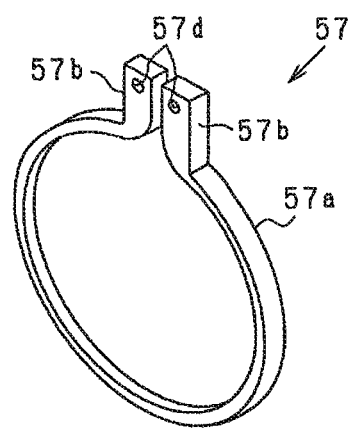
FIGS. 12A and 12B are perspective views showing a latch ring and a latch state thereof.
Figure 12B:
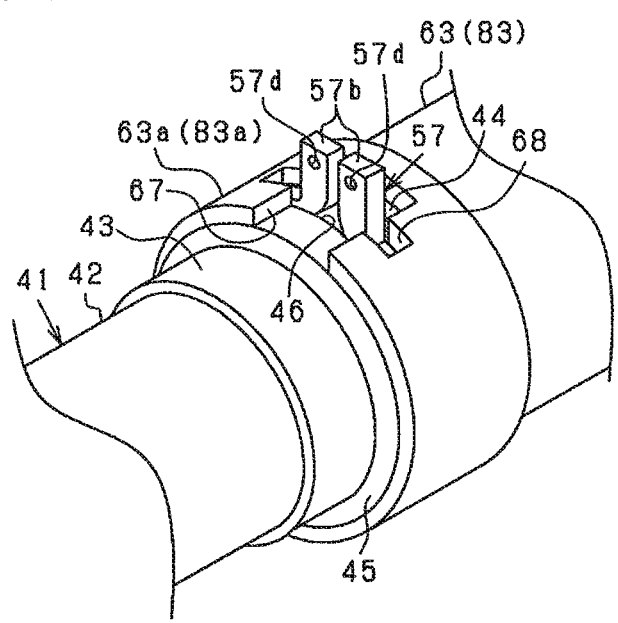

FIG. 12A is a perspective view showing the latch ring 57, and FIG. 12B is a perspective view showing a latch state thereof.

The latch ring 57 includes a latch ring main body 57a formed in a C shape, and a pick portion 57b provided on each end portion of the latch ring main body 57a.

The latch ring main body 57a engages with both the groove 46 provided in the end portion 43 of the outer pipe 41 and the groove 65 provided in the enlarged diameter part 63a of the outer pipe connecting portion 63. For this purpose, a radial direction thickness of the latch ring main body 57a is constant around the entire circumference of the latch ring main body 57a and slightly smaller than a sum total of a depth of the groove 46 and a depth of the groove 65. The radial direction thickness of the latch ring main body 57a is also constant in a width direction of the latch ring main body 57a (a central axis direction of the latch ring main body 57a).

The pick portion 57b projects in an outer diameter direction of the latch ring main body 57a from each end portion of the latch ring main body 57a. A width of the pick portion 57b is set to be equal to the width of the latch ring main body 57a.

The width of the latch ring main body 57a and the pick portion 57b is set to be slightly smaller than the width of the groove 46 provided in the end portion 43 of the outer pipe 41 and the width of the groove 65 provided in the enlarged diameter part 63a of the outer pipe connecting portion 63.

Here, a width of the peeping portion 68 in the extension direction of the outer pipe connecting portion 63 is slightly greater than the width of the groove 65 provided in the enlarged diameter part 63a. As a result, the state of the latch ring 57 fitted into the groove 65 can be checked through the peeping portion 68.

The latch ring 57 is formed from an elastic material such as spring steel, for example. In the latch ring 57, the pick portions 57b are separated from each other in a natural state (an unattached state). When the latch ring main body 57a is compressed such that the pick portions 57b approach each other, the outer diameter of the latch ring main body 57a becomes slightly smaller than an inner diameter of the groove 65 in the outer pipe connecting portion 63.

At this time, a width occupied by the pick portions 57b in a circumferential direction of the latch ring main body 57a, or in other words an interval between the ends of the two pick portions 57b, becomes narrower than the width of the insertion portion 67 provided in the enlarged diameter part 63a of the outer pipe connecting portion 63. When the latch ring main body 57a is in an open state, on the other hand, the outer diameter of the latch ring main body 57a is larger than the inner diameter of the groove 65 in the outer pipe connecting portion 63.

A through hole 57d extending in a width direction of the latch ring 57 is provided in each pick portion 57b. The through holes 57d are formed with dimensions enabling insertion of a tool that is used to compress the latch ring main body 57a.

With this constitution, the end portion 43 of the outer pipe 41 and the enlarged diameter part 63a of the outer pipe connecting portion 63 are connected through a following procedure.

The latch ring main body 57a is widened and passed over the end portion 43 of the outer pipe 41 until the latch ring main body 57a is disposed in alignment with the groove 46 formed in the end portion 43. Next, the tool is inserted into the through holes 57d in the pick portions 57b to compress the latch ring min body 57a. As a result, the latch ring main body 57a is engaged with the groove 46 in the end portion 43.

At this time, the interval between the ends of the two pick portions 57b is narrower than the width of the insertion portion 67 of the outer pipe connecting portion 63. Therefore, the end portion 43 of the outer pipe 41 can be inserted into the outer pipe connecting portion 63 in the axial direction of the outer pipe 41 while maintaining this state.

When the groove 65 in the outer pipe connecting portion 63 and the latch ring 57 are aligned, the latch ring 57 is released. As a result, the latch ring 57 is widened by its own elasticity such that the outer surface of the latch ring main body 57a contacts the inner surface of the groove 65 in the outer pipe connecting portion 63.

Thus, the latch ring 57 engages with both the groove 46 in the end portion 43 of the outer pipe 41 and the groove 65 in the enlarged diameter part 63a of the outer pipe connecting portion 63. As a result, the end portion 43 of the outer pipe and the enlarged diameter part 63a of the outer pipe connecting portion 63 are connected.

The connection between the end portion 43 of the outer pipe 41 and the enlarged diameter part 63a of the outer pipe connecting portion 63 is released through a following procedure.

The tool is inserted into the through holes 57d in the pick portions 57b to compress the latch ring min body 57a. As a result, the latch ring 57 engages with the groove 46 in the end portion 43 of the outer pipe 41 but separates from the groove 65 in the outer pipe connecting portion 63. In other words, the latch ring main body 57a is accommodated within the groove 46 formed in the end portion 43 of the outer pipe 41.

At this time, the interval between the ends of the two pick portions 57b is narrower than the width of the insertion portion 67 of the outer pipe connecting portion 63. Therefore, the end portion 43 of the outer pipe 41 can be withdrawn from the outer pipe connecting portion 63 in the axial direction of the outer pipe 41 while maintaining this state.

Figure 13:
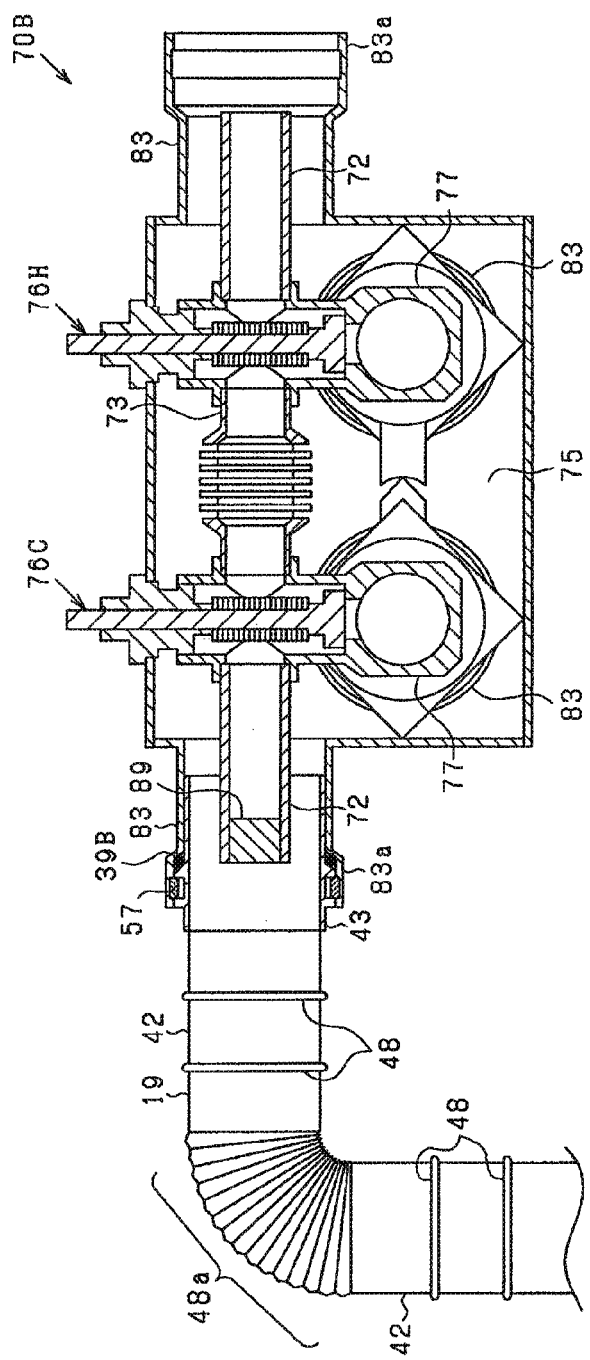
FIG. 13 is a sectional view showing a connection between a suction passage of a vacuum pump and the valve unit.

FIG. 13 is a sectional view showing a connection between the suction passage 19 of the vacuum pump and the collection side valve unit 70B. The suction passage 19 is formed by omitting the inner pipe 31 from the vacuum double pipe 30, and further includes a bellows portion 48a.

A connecting structure between the suction passage 19 and the outer pipe connecting portion 83 of the valve unit 70B is similar to the connecting structure between the outer pipe 41 of the vacuum double pipe 30 and the outer pipe connecting portion 83(63). Accordingly, identical members have been allocated identical reference symbols, and description thereof has been omitted.

In the interior of the outer pipe connecting portion 83 to which the suction passage 19 is connected, a sealing plug 89 is provided on an end portion of the second flow passage portion 72 of the valve unit 70B. The sealing plug 89 seals the end portion of the second fluid passage portion 72. Therefore, the Galden flowing through the interior of the second fluid passage portion 72 is prevented from leaking out from the end portion of the second fluid passage portion 72.

The evacuation passage 75 of the valve unit 70B communicates with the suction passage 19. Thus, the evacuation passage 75 can be evacuated to a vacuum by the vacuum pump through the suction passage 19.

The bellows portion 48a is provided on the outer pipe main body 42. The bellows portion 48a is formed by forming the plurality of aforesaid node portions 48 of the outer pipe 41 continuously. In so doing, the outer pipe main body 42 and the bellows portion 48a can be formed integrally.

More specifically, to form the node portions 48 and the bellows portion 48a on the outer pipe main body 42, the outer pipe main body 42 is formed in a rectilinear shape. The rectilinear outer pipe main body 42 is then bent at the bellows portion 48a in accordance with a positional relationship between the valve unit 70B and the vacuum pump. The bellows portion 48a is thereby caused to function as a bend joint.

The temperature control system constituted as described above is controlled in the following manner. Note that the control to be described below may be executed either by an operator or by a control unit of the temperature control system.

As shown in FIG. 2, the vacuum pump is driven such that the evacuation passage 75 of the collection side valve unit 70B is evacuated to a vacuum through the suction passage 19.

Here, the evacuation passage 75 communicates with the entire interior of the valve case 81. Hence, in each outer pipe connecting portion 83 of the valve case 81, the evacuation passage 75 communicates with the space (the evacuation passage 37) between the inner pipe 31 and the outer pipe 41 of each vacuum double pipe 30. As a result, the vacuum double pipe 30 of each passage connected to the valve unit 70B is evacuated to a vacuum. More specifically, the vacuum double pipes 30 respectively constituting the high temperature side collection passage 22H, the low temperature side collection passage 22C, the discharge passage 24W, the high temperature side bypass passage 25H, and the low temperature side bypass passage 25C are evacuated to a vacuum.

Further, the evacuation passage 75 of the supply side valve unit 70A is evacuated to a vacuum through the bypass passages 25H, 25C. For this purpose, the vacuum double pipes 30 of the other passages connected to the valve unit 70A are evacuated to a vacuum. More specifically, the vacuum double pipes 30 respectively constituting the high temperature side supply passage 21H, the low temperature side supply passage 21C, and the introduction passage 23W are evacuated to a vacuum. Note that the respective end portions of the inner pipe and outer pipe of the preparatory passage 87 are sealed by the sealing flange 87a.

Here, the respective vacuum double pipes 30 are connected by the joints 50, 50U. Further, the evacuation passages 37 of the vacuum double pipes 30 communicate with the evacuation passages 55 of the joints 50, 50U. Therefore, by evacuating the vacuum double pipes 30 to a vacuum, the evacuation passages 55 of the joints 50, 50U can be evacuated to a vacuum.

Furthermore, the evacuation passages 55 of the joints 50, 50U connect the evacuation passages 37 of the respective vacuum double pipes 30 connected thereto. Hence, by evacuating one vacuum double pipe 30 to a vacuum, a plurality of vacuum double pipes 30 can be evacuated to a vacuum together through the evacuation passages 55 of the joints 50, 50U.

Hence, by evacuating the evacuation passage 75 of the collection side valve unit 70B to a vacuum through the suction passage 19 in this manner, all of the passages constituting the temperature control system can be evacuated to a vacuum together.

Next, the open/close valves 11H, 12H, 11C, 12C of the supply unit 10 are respectively set in an open state. Openings of the throttle valves 17H, 17C are then adjusted on the basis of detection values obtained by the manometers 16H, 16C. In other words, high temperature Galden and low temperature Galden are constantly caused to flow through the bypass passages 25H, 25C a little at a time.

Therefore, even when one of the high temperature Galden and the low temperature Galden is caused to flow to the work piece holder 15, high temperature Galden flows through the high temperature side supply passage 21H and the high temperature side collection passage 22H at all times while low temperature Galden flows through the low temperature side supply passage 21C and the low temperature side collection passage 22C at all times. As a result, a temperature reduction in the high temperature side supply passage 21H and the high temperature side collection passage 22H and a temperature increase in the low temperature side supply passage 21C and the low temperature side collection passage 22C can be suppressed.

Thereafter, the states of the valves 70A, 70B are switched at predetermined timings such that high temperature Galden and low temperature Galden are caused to flow to the work piece holder 15 alternately.

For example, to cause high temperature Galden to flow to the work piece holder 15, the high temperature side supply passage 21H is connected to the introduction passage 23W and the low temperature side supply passage 21C is blocked from the introduction passage 23W by the supply side valve unit 70A. Further, the high temperature side collection passage 22H is connected to the discharge passage 24W and the low temperature side collection passage 22C is blocked from the discharge passage 24W by the collection side valve unit 70B.

In the vacuum double pipes 30 constituting the introduction passage 23W and the discharge passage 24W, the thermal capacity of the inner pipe main body 32 and the outer pipe main body 42 is smaller than that of a conventional vacuum double pipe. Therefore, even when the temperature of the Galden flowing through the introduction passage 23W and discharge passage 24W is modified, an amount of thermal energy absorbed as temperature variation in these passages 23W, 24W can be reduced.

Thus, the Galden is caused to flow through the flow passage in the inner pipe 31 of each vacuum double pipe 30. Further, a plurality of vacuum double pipes 30 are connected to each other by the joints 50, 50U, and therefore the Galden is caused to flow through the flow passage of each inner pipe 31 via the joints 50, 50U.

At this time, a differential pressure between the pressure of the Galden flowing through the interior of the inner pipe 31 and the pressure of the evacuation passage 37 acts on the inner pipe 31, while a differential pressure between the pressure of the evacuation passage 37 and atmospheric pressure acts on the outer pipe 41. With regard to this point, the node portions 38, 48 are formed in the inner pipe 31 and outer pipe 41 of the vacuum double pipe 30, and therefore the strength of the inner pipe 31 and outer pipe 41 can be improved.

Further, when the Galden is caused to flow through the inner pipe 31 of the vacuum double pipe 30, the inner pipe 31 and the outer pipe 41 expand and contract in response to temperature variation in the inner pipe 31 and outer pipe 41. With regard to this point, the inner pipe sealing structure is constituted such that the end portion 33 of the inner pipe 31 and the inner pipe connecting portion 53 (the connecting portion of the second fluid passage portion 72) are sealed in the radial direction of the inner pipe 31 by the O ring 39A, and therefore relative movement can be permitted between the inner pipe 31 and the inner pipe connecting portion 53 in the extension direction of the inner pipe 31 (the axial direction of the inner pipe 31).

High temperature Galden and low temperature Galden flow alternately through the introduction passage 23W and the discharge passage 24W. Therefore, temperature variation causes the vacuum double pipes 30 and L shaped joints 50 constituting the introduction passage 23W and the discharge passage 24W to expand and contract to a greater degree than the other passages. Even in this case, however, expansion and contraction of the inner pipe 31 caused by temperature variation therein can be absorbed by the plurality of node portions 38 formed at intervals in the inner pipe 31. Furthermore, a water hammer phenomenon occurring when the Galden is caused to flow and then blocked can be suppressed by the node portions 38.

Similarly, high temperature Galden and low temperature Galden flow alternately through the second fluid passage portion 72 and connecting passage portion 73 of the valve units 70A, 70B. With regard to this point, the connecting passage portion 73 includes the bellows portion 73a, and therefore, even when the temperature of the Galden flowing through the second fluid passage portion 72 is modified, expansion and contraction of the second fluid passage portion 72 caused by this temperature variation can be absorbed by the bellows portion 73a.

Furthermore, in the U shaped joint 50U, expansion and contraction of the inner pipe joint portion 51 and the outer pipe joint portion main body 62 can be absorbed by the inner pipe bellows portion 56 and the outer pipe bellows portion 66, respectively.

Note that when the temperature control system is halted, the vacuum double pipes 30, joints 50, 50U, and valve units 70A, 70B can be disconnected for maintenance or the like.

More specifically, in the outer pipe connecting structure, the outer pipe 41 and the outer pipe connecting portion 63 (83) are connected detachably by the latch ring 57, and therefore the outer pipe 41 and the outer pipe connecting portion 63 can be disconnected. At this time, relative movement is permitted between the inner pipe 31 and the inner pipe connecting portion 53 (the connecting portion of the second fluid passage portion 72) in the extension direction of the inner pipe 31, and therefore the connection between the inner pipe 31 and the inner pipe connecting portion 53 can be released at the same time as that of the outer pipe 41 and the outer pipe connecting portion 63.

Here, the outer pipe 41 and the outer pipe connecting portion 63, 83 can be disconnected by manipulating the latch ring 57 via the manipulating portion 69. At this time, the inner pipe 31 and the inner pipe connecting portion 53 cannot be manipulated externally, but since a seal is formed between the inner pipe 31 and the inner pipe connecting portion 53 by the O ring 39A only in the radial direction of the inner pipe 31, the inner pipe 31 can be disconnected from the inner pipe connecting portion 53 (the connecting portion of the second fluid passage portion 72) by pulling apart the vacuum double pipe 30 and the joint 50, 50U (the valve unit 70A, 70B) in the extension direction of the double pipe 30.

This embodiment, described in detail above, has the following advantages.

The inner pipe 31 of the vacuum double pipe 30 is covered by the outer pipe 41, and the evacuation passage 37 is formed by the space between the outer surface of the inner pipe 31 and the inner surface of the outer pipe 41. The evacuation passage 37 is open at both end parts and tightly closed at a midway part in the extension direction (lengthwise direction) of the inner pipe 31.

Hence, by evacuating the evacuation passage 37 of one vacuum double pipe 30 to a vacuum, the joints 50, 50U and valve units 70A, 70B connected to the vacuum double pipe 30, and accordingly the other vacuum double pipes 30 connected via the joints 50, 50U and valve units 70A, 70B, can be evacuated to a vacuum. As a result, the labor (number of operating steps and operation time) required to evacuate the vacuum double pipes 30 to a vacuum can be reduced.

The plurality of node portions 38, 48 obtained by bending the pipe walls of the inner pipe main body 32 of the inner pipe 31 and the outer pipe main body 42 of the outer pipe 41 to project in an annular shape outwardly in the radial direction are formed at intervals in the inner pipe main body 32 and the outer pipe main body 42, respectively. With the node portions 38, 48, improvements in strength relative to internal pressure acting on the inner pipe main body 32 and external pressure acting on the outer pipe main body 42 can be achieved. Hence, strength can be secured in the inner pipe main body 32 and the outer pipe main body 42 even when the pipe walls thereof are reduced in weight by being reduced in thickness.

Furthermore, expansion and contraction of the inner pipe 31 and outer pipe 41 caused by temperature variation therein can be absorbed respectively by the plurality of node portions 38, 48 formed at intervals. Hence, even when the vacuum double pipe 30 is not provided with an expansion/contraction bellows, thermal stress in the double pipe 30 can be alleviated.

Further, the node portions 38, 48 are formed by bending the pipe walls of the inner pipe main body 32 and the outer pipe main body 42 to project in an annular shape outwardly in the radial direction, and therefore the node portions 38, 48 can be formed easily by compressing the inner pipe main body 32 and the outer pipe main body 42 in the lengthwise direction (axial direction) thereof.

The plurality of node portions 48 are formed at intervals in the outer pipe main body 42, and therefore the pipe wall of the outer pipe main body 42 can be made thinner. Hence, the pipe wall member constituting the larger-volume outer pipe main body 42 can be reduced in weight, and as a result, the double pipe 30 can be reduced in weight effectively.

When the temperature of the Galden flowing through the inner pipe 31 is modified such that temperature variation in the inner pipe 31 increases, expansion and contraction of the inner pipe 31 can be absorbed by the plurality of node portions 38 provided in the inner pipe main body 32. As a result, thermal stress in the double pipe 30 can be alleviated.

The inner pipe main body 32 and the outer pipe main body 42 are supported relative to each other in a state of line contact. Hence, the inner pipe main body 32 and the outer pipe main body 42 can be supported relative to each other while suppressing thermal conduction between the inner pipe 31 and the outer pipe 41.

Similarly, the valve main body 77 and the valve case main body 82 are supported relative to each other in a state of line contact, and therefore the valve main body 77 and the valve case main body 82 can be supported relative to each other while suppressing thermal conduction therebetween.

More specifically, the support rings 35A, 35C having a plurality of angle portions on their outer surfaces and the support piece 86C are mounted on the outer peripheries of the inner pipe main body 32, the inner pipe joint portion 51, and the valve main body 77, respectively, and therefore respective constitutions for supporting the outer pipe main body 42, the outer pipe joint portion main body 62, and the valve case main body 82 in line contact can be realized easily.

Respective support rings 35A are mounted by being fitted to the node portions 38 formed on the inner pipe main body 32, and therefore an interval between the support rings 35A can be adjusted easily. Furthermore, the node portions 38 project in an annular shape outwardly in the radial direction of the inner pipe main body 32, and therefore movement of the support rings 35A in the extension direction of the inner pipe main body 32 is suppressed easily by the node portions 38.

By evacuating the space (the evacuation passage 37) between the inner pipe 31 and the outer pipe 41 of the vacuum double pipe 30 to a vacuum, the evacuation passages 55 of the joints 50, 50U and the evacuation passages 75 of the valve units 70A, 70B communicating with the evacuation passage 37 can be evacuated to a vacuum. Thus, improvements can be achieved in thermal insulation between the inner pipe joint portion 51 and the outer pipe joint portion main body 62 of the joints 50, 50U and thermal insulation between the fluid passage portions 71H, 71C, 72 of the valve units 70A, 70B and the valve case 81. As a result, deterioration of the thermal insulation property of the vacuum double pipe 30 in the joint 50, 50U parts and the valve unit 70A, 70B parts can be suppressed.

Moreover, the evacuation passages 55, 75 connect the evacuation passages 37 of respective vacuum double pipes 30 to each other, and therefore, by evacuating one vacuum double pipe 30 to a vacuum, a plurality of vacuum double pipes 30 can be evacuated to a vacuum together in a single operation via the evacuation passages 55, 75. As a result, the labor required to evacuate the vacuum double pipe 30 to a vacuum can be reduced.

In the inner pipe sealing structure, the end portion 33 of the inner pipe 31 and the inner pipe connecting portion 53 (the connecting portion of the second fluid passage portion 72) are sealed in the radial direction of the inner pipe 31 by the O ring 39A, and therefore relative movement can be permitted between the inner pipe 31 and the inner pipe connecting portion 53 in the extension direction of the inner pipe 31 (the axial direction of the inner pipe 31). Hence, expansion and contraction caused by temperature variation in the inner pipe 31 can be absorbed, and as a result, thermal stress generated in the vacuum double pipe 30 and the joints 50, 50U (the valve units 70A, 70B) can be alleviated.

Further, in the outer pipe connecting structure, the end portion 43 of the outer pipe 41 and the outer pipe connecting portion 63, 83 are connected detachably by the latch ring 57, and therefore the outer pipe 41 and the outer pipe connecting portion 63, 83 can be disconnected for maintenance or the like. At this time, relative movement is permitted between the inner pipe 31 and the inner pipe connecting portion 53 in the extension direction of the inner pipe 31, and therefore the inner pipe 31 and the inner pipe connecting portion 53 can be disconnected at the same time as the outer pipe 41 and the outer pipe connecting portion 63.

In the outer pipe sealing structure, the end portion 43 of the outer pipe 41 and the enlarged diameter part 63a, 83a of the outer pipe connecting portion 63, 83 are sealed in the extension direction of the outer pipe 41 (the axial direction of the vacuum double pipe 30) by the O ring 39B, and therefore, by moving the vacuum double pipe 30 relative to the joint 50, 50U (the valve unit 70A, 70B) in the extension direction of the outer pipe 41, a seal can be formed between the outer pipe 41 and the outer pipe connecting portion 63, 83. In other words, by attaching the vacuum double pipe 30 into the joint 50, 50U through insertion in the extension direction of the outer pipe 41, a seal can be formed between the end portion 43 of the outer pipe 41 and the enlarged diameter part 63a, 83a of the outer pipe connecting portion 63, 83.

At this time, in the inner pipe sealing structure described above, the end portion 33 of the inner pipe 31 and the inner pipe connecting portion 53 are sealed in the radial direction of the inner pipe 31 by the O ring 39A. Therefore, by attaching the vacuum double pipe 30 to the joint 50, 50U through insertion in the extension direction of the outer pipe 41, a seal can be formed between the inner pipe 31 and the inner pipe connecting portion 53 at the same time.

Furthermore, the connection between the end portion 43 of the outer pipe 41 and the outer pipe connecting portion 63, 83 is maintained by the outer pipe connecting structure in a state where the O ring 39B is deformed by a predetermined amount. Hence, the deformation amount of the O ring 39B, or in other words the sealing state produced by the outer pipe connecting structure, can be stabilized. Moreover, since this state is maintained by the outer pipe connecting structure, relative movement between the inner pipe 31 and the outer pipe connecting portion 63, 83 in the extension direction of the inner pipe 31 can be restricted.

The first fluid passage portions 71C, 71H are respectively skewed relative to the second fluid passage portion 72, and therefore the first fluid passage portions 71C, 71H and the second fluid passage portion 72 are connected via the respective valves 76H, 76C without intersecting. Hence, even when temperature differences occur between the Galden flowing through the first fluid passage portions 71C, 71H and the Galden flowing through the second fluid passage portion 72, thermal conduction between the first fluid passage portions 71C, 71H and the second fluid passage portion 72 can be suppressed. As a result, thermal energy loss in the Galden can be suppressed.

The set including the fluid passage portions 71H, 72 and the valve main body 77 of the high temperature side valve 76H and the set including the fluid passage portions 71C, 72 and the valve main body 77 of the low temperature side valve 76C are covered by the valve case 81. Further, the evacuation passage 75 formed by the space between the valve case 81 and the fluid passage portions 71H, 71C, 72, connecting passage portion 73, and valves 76H, 76C is evacuated to a vacuum. Hence, two sets of fluid passage portions and valves can be housed in the single valve case 81 while suppressing a reduction in thermal insulation between the two sets. As a result, the overall size of the valve units 70A, 70B including the two sets of fluid passage portions and valves can be reduced.

Furthermore, by evacuating a single vacuum double pipe 30 to a vacuum, the vacuum double pipes 30 corresponding to the plurality of sets can be evacuated to a vacuum together through the evacuation passages 75 of the valve units 70A, 70B. Hence, the labor required to evacuate the vacuum double pipes 30 to a vacuum can be reduced in comparison with a case where a set of the high temperature side first fluid passage portion 71H and valve 76H and a set of the low temperature side first fluid passage portion 71C and valve 76C are housed in the valve case 81 separately.

The respective sets of the second fluid passage portion 72 are connected to each other via the connecting passage portion 73, and therefore the plurality of sets of second fluid passage portions 72 can be joined such that the Galden flows into the common second fluid passage portion 72 from the first fluid passage portions 71H, 71C. As a result, the temperature of the fluid flowing through the second fluid passage portion 72 can be modified by making the temperature of the Galden flowing through the first fluid passage portion 71H different to the temperature of the Galden flowing through the first fluid passage portion 71C.

Here, the connecting passage portion 73 includes the bellows portion 73a, and therefore, even when the temperature of the Galden flowing through the second fluid passage portion 72 is modified, expansion and contraction of the second fluid passage portion 72 due to this temperature variation can be absorbed by the bellows portion 73*a*. As a result, thermal stress generated in the second fluid passage portion 72 and the valves 76H, 76C can be alleviated.

By manipulating the latch ring 57 via the manipulating portion 69, the outer pipe 41 and the outer pipe connecting portion 63 (83) can be disconnected. At this time, a seal is formed between the inner pipe 31 and the inner pipe connecting portion 53 (the connecting portion of the second fluid passage portion 72) by the O ring 39A only in the radial direction of the inner pipe 31, and therefore the inner pipe 31 can be disconnected from the inner pipe connecting portion 53 by pulling apart the vacuum double pipe 30 and the joint 50, 50U (the valve unit 70A, 70B) in the extension direction of the double pipe 30. As a result, the vacuum double pipe 30 and the joint 50, 50U can be disconnected easily.

The manipulating portion 69 is constituted to include the peeping portion 68 through which it is possible to confirm visually whether the outer pipe 41 has been connected to the outer pipe connecting portion 63, 83 by the latch ring 57. Therefore, the manipulating portion 69 enabling manipulation of the latch ring 57 can be caused to function as the peeping portion 68 through which the connection between the outer pipe 41 and the outer pipe connecting portion 63, 83 can be visually confirmed. Hence, the outer pipe 41 and the outer pipe connecting portion 63, 83 can be connected more reliably while suppressing an increase in a number of processing steps required to provide the peeping portion 68.

The bellows portion 48*a* is formed in the suction passage 19 by forming the plurality of node portions 48 continuously. Hence, the pipe can be bent at the bellows portion 48*a*, and as a result, the bellows portion 48*a* can be caused to function as a bend joint. Therefore, a long suction passage 19 can be formed integrally in a case where the suction passage 19 is to be disposed in a bent state. As a result, the number of connecting portions in the suction passage 19 can be reduced, enabling an improvement in a sealing property of the suction passage 19.

The first configuration show in summary of the invention may be modified as follows.

A second configuration pertaining to the first configuration further includes: an inner pipe sealing structure for forming a seal between the inner pipe and the inner pipe connecting portion in a radial direction of the inner pipe; and outer pipe sealing structure for forming a seal between the outer pipe and the outer pipe connecting portion; and an outer pipe connecting structure for connecting the outer pipe and the outer pipe connecting portion detachably.

According to this constitution, a seal is formed between the inner pipe and the inner pipe connecting portion by the inner pipe sealing structure, and a seal is formed between the outer pipe and the outer pipe connecting portion by the outer pipe sealing structure.

Here, the inner pipe sealing structure seals the inner pipe and the inner pipe connecting portion in the radial direction of the inner pipe, and therefore relative movement between the inner pipe and the inner pipe connecting portion in an extension direction of the inner pipe (an axial direction of the inner pipe) can be permitted. Hence, expansion and contraction of the inner pipe due to temperature variation therein can be absorbed, and as a result, thermal stress in the vacuum double pipe and the joint can be alleviated.

Further, the outer pipe connecting structure connects the outer pipe and the outer pipe connecting portion detachably, and therefore the outer pipe and the outer pipe connecting portion can be disconnected for maintenance and the like. At this time, relative movement between the inner pipe and the inner pipe connecting portion in the extension direction of the inner pipe is permitted, and therefore the inner pipe and the inner pipe connecting portion can be disconnected at the same time as the outer pipe and the outer pipe connecting portion.

As a connected structure of the vacuum double pipes, a first constitution includes: a vacuum double pipe having an outer pipe that covers an inner pipe such that a vacuum is formed between the inner pipe and the outer pipe; an inner pipe joint member having an inner pipe connecting portion connected to the inner pipe and an interior flow passage that communicates with a flow passage of the inner pipe; an outer pipe joint member that has an outer pipe connecting portion connected to the outer pipe and covers the inner pipe joint member so as to be integrated with the inner pipe joint member; an inner pipe sealing member that forms a seal between the inner pipe and the inner pipe connecting portion in a radial direction of the inner pipe; an outer pipe sealing member that forms a seal between the outer pipe and the outer pipe connecting portion; and a connecting member that connects the outer pipe and the outer pipe connecting portion detachably.

According to this constitution, actions and effects conforming to the second configuration can be exhibited. Note that the first constitution is not limited to a constitution for connecting a plurality of vacuum double pipes to each other, and may be applied to a part for connecting the vacuum double pipe to the two joint members (the inner pipe joint member and outer pipe joint member).

In a second constitution pertaining to the first constitution, the inner pipe connecting portion and the outer pipe connecting portion are connected via a bellows, and a seal is formed between the inner pipe connecting portion and the outer pipe connecting portion by the bellows.

According to this constitution, the inner pipe connecting portion and the outer pipe connecting portion are connected by the bellows, and therefore an expansion/contraction difference between the inner pipe and the outer pipe due to temperature variation can be absorbed. As a result, thermal stress in the vacuum double pipe can be alleviated.

Further, the inner pipe connecting portion and the outer pipe connecting portion are sealed by the bellows, and therefore a space communicating with the space between the inner pipe and the outer pipe can be sealed by the bellows. Hence, by evacuating the space between the inner pipe and the outer pipe of the vacuum double pipe to a vacuum, the space between the inner pipe connecting portion and the outer pipe connecting portion can be evacuated to a vacuum. As a result, thermal insulation between the inner pipe connecting portion and the outer pipe connecting portion can be improved.

In a third configuration pertaining to the second configuration, the outer pipe sealing structure includes an outer pipe sealing member for forming a seal between the outer pipe and the outer pipe connecting portion in an extension direction of the outer pipe, and the outer pipe connector maintains a connection between the outer pipe and the outer pipe connecting portion in a state where the outer pipe sealing member is deformed by a predetermined amount.

According to this constitution, the outer pipe sealing structure includes the outer pipe sealing member for forming a seal between the outer pipe and the outer pipe connecting portion in the extension direction of the outer pipe (the axial direction of the vacuum double pipe). Therefore, by moving the vacuum double pipe and the joint (the two joint members) relative to each other in the extension direction of the outer pipe, a seal can be formed between the outer pipe and the outer pipe connecting portion. In other words, by attaching the vacuum double pipe and the joint in the extension direction of the outer pipe through insertion, a seal can be formed between the outer pipe and the outer pipe connecting portion.

At this time, as noted above, a seal is formed between the inner pipe and the inner pipe connecting portion in the radial direction of the inner pipe by the inner pipe sealing structure, and therefore, by attaching the vacuum double pipe and the joint through insertion in the extension direction of the outer pipe, a seal can be formed between the inner pipe and the inner pipe connecting portion at the same time.

Furthermore, the connection between the outer pipe and the outer pipe connecting portion is maintained by the outer pipe connectors in a state where the outer pipe sealing member is deformed by a predetermined amount, and therefore the deformation amount of the outer pipe sealing member, or in other words the seal formed by the outer pipe sealing structure, can be stabilized. Moreover, since this state is maintained by the outer pipe connector, relative movement between the inner pipe and the inner pipe connector in the extension direction of the inner pipe can be restricted.

In a fourth configuration pertaining to the second configuration, the outer pipe connecting portion is provided with a manipulating portion that is capable of manipulating the connecting member to disconnect the outer pipe and the outer pipe connecting portion.

According to this constitution, the outer pipe and the outer pipe connecting portion can be disconnected by manipulating the connecting member via the manipulating portion. At this time, the inner pipe and the inner pipe connecting portion cannot be manipulated externally. However, the inner pipe and the inner pipe connecting portion are sealed by the inner pipe sealing member only in the radial direction of the inner pipe.

Therefore, by pulling the vacuum double pipe and the joint apart in a pipe extension direction, the inner pipe and the inner pipe connecting portion can be disconnected. As a result, the vacuum double pipe and the joint can be disconnected easily.

Note that a notch portion or the like provided in the outer pipe connecting portion may be employed as the manipulating portion.

Further, in a fifth configuration pertaining to the fourth configuration, the manipulating portion includes a visual confirmation portion enabling visual confirmation of whether or not the outer pipe and the outer pipe connecting portion are connected by the connecting member. Thus, the manipulating portion for manipulating the connecting member can be caused to function as the visual confirmation portion for visually confirming the connection between the outer pipe and the outer pipe connecting portion. As a result, the outer pipe and the outer pipe connecting portion can be connected more reliably while suppressing an increase in a number of processing steps required to provide the visual confirmation portion.

In a sixth configuration pertaining to the first configuration, a plurality of node portions projecting in an annular shape outwardly in the radial direction are formed at intervals in at least one of the inner pipe and the outer pipe of the vacuum double pipe by bending a pipe wall thereof.

A fluid flows through the interior of the inner pipe while the inner pipe and the outer pipe are thermally insulated from each other by the vacuum. Therefore, a differential pressure between a pressure of the fluid flowing through the inner pipe and a pressure of the evacuation passage acts on the inner pipe, while a differential pressure between the pressure in the evacuation passage and atmospheric pressure acts on the outer pipe.

Here, the plurality of node portions projecting in an annular shape outwardly in the radial direction are formed at intervals in at least one of the inner pipe and the outer pipe by bending the pipe wall thereof. Hence, improvements in strength relative to internal pressure acting on the inner pipe and external pressure acting on the outer pipe can be achieved. As a result, strength can be secured in the pipe even when the pipe walls of the inner pipe and the outer pipe are reduced in weight by being reduced in thickness.

Furthermore, expansion and contraction of the inner pipe and outer pipe due to temperature variation can be absorbed by the plurality of node portions formed at intervals. Hence, thermal stress in the double pipe can be alleviated even when the double pipe is not provided with an expansion/contraction bellows.

Further, the node portions are formed by bending the pipe walls of the inner pipe and the outer pipe to project in an annular shape outwardly in the radial direction, and therefore the node portions can be formed easily by compressing the inner pipe and the outer pipe in the extension direction (axial direction) thereof.

In the vacuum double pipe, the outer pipe covers the inner pipe, and therefore, if the inner pipe and the outer pipe have an identical pipe wall thickness, a volume of a member constituting the pipe wall of the outer pipe is greater than a volume of a member constituting the pipe wall of the inner pipe.

With regard to this point, in a seventh configuration pertaining to the sixth configuration, the plurality of node portions are formed at intervals in the outer pipe, and therefore the pipe wall of the outer pipe can be reduced in thickness. As a result, the pipe wall member of the larger-volume outer pipe can be reduced in weight, and therefore the double pipe can be reduced in weight effectively.

In an eighth configuration pertaining to the sixth configuration, the plurality of node portions are formed at intervals in the inner pipe, and therefore the pipe wall of the inner pipe can be reduced in thickness. As a result, a thermal capacity of the inner pipe can be reduced such that even when the temperature of the fluid flowing through the inner pipe is modified, heat loss can be suppressed. Furthermore, in this case, expansion and contraction of the inner pipe can be absorbed by the plurality of node portions provided in the inner pipe, and as a result, thermal stress in the double pipe can be alleviated.

In a ninth configuration pertaining to the sixth configuration, the plurality of node portions are formed at intervals in both the inner pipe and the outer pipe. Therefore, both the inner pipe and the outer pipe can be reduced in weight, and thermal stress generated in the double pipe can be alleviated even further.

In a tenth configuration pertaining to the sixth configuration, the plurality of node portions are formed at intervals in at least one of the inner pipe and the outer pipe, and by forming the plurality of node portions continuously, a bellows portion is formed.

According to this constitution, the plurality of node portions are formed at intervals in at least one of the inner pipe and the outer pipe, and therefore the pipe wall of the corresponding pipe can be made thinner while securing strength therein. Furthermore, when the pipe wall is made thinner in this manner, the plurality of node portions can be formed continuously, and therefore the bellows portion can be formed by the node portions.

Hence, the pipe can be bent at the bellows portion, and the bellows portion can therefore be caused to function as a bend joint. Accordingly, a long pipe can be formed integrally in a case where the pipe is to be disposed in a bent state. As a result, the number of connecting portions in the pipe can be reduced, enabling an improvement in a sealing property of the pipe.

In an eleventh configuration pertaining to the sixth configuration, the inner pipe and the outer pipe are supported relative to each other in a state of point contact or line contact. Therefore, the inner pipe and the outer pipe can be supported relative to each other while suppressing thermal conduction therebetween.

Note that the inner pipe and outer pipe may be set in a state of point contact or line contact using parts thereof or using another member attached thereto.

More specifically, as indicated by a twelfth configuration pertaining to the eleventh configuration, a constitution whereby a support member is mounted on an outer periphery of the inner pipe, a plurality of projecting portions are provided on an outer periphery of the support member, and the outer pipe is supported in a state of point contact or line contact by the plurality of projecting portions may be employed.

According to this constitution, the support member having the plurality of projecting portions on its outer periphery is mounted on the outer periphery of the inner pipe, and therefore the outer pipe can be supported in a state of point contact or line contact easily.

In a thirteenth configuration pertaining to the twelfth configuration, the plurality of node portions are formed at intervals in the inner pipe, and the support member is mounted on the node portions of the inner pipe.

According to this constitution, the support member is mounted in alignment with the node portions formed in the inner pipe, and therefore an interval between respective support members can be adjusted easily. Further, the node portions project in an annular shape outwardly in the radial direction of the inner pipe, and therefore movement of the support member in the extension direction of the inner pipe can be suppressed by the node portions easily.

In a fourteenth configuration pertaining to the first configuration, the inner pipe joint portion and the outer pipe joint portion of the joint are supported relative to each other in a state of point contact or line contact. Therefore, the inner pipe joint portion and the outer pipe joint portion can be supported relative to each other while suppressing thermal conduction therebetween.

Note that the inner pipe joint portion and outer pipe joint portion may be set in a state of point contact or line contact using parts thereof or using another member attached thereto.

More specifically, as indicated by a fifteenth configuration pertaining to the fourteenth configuration, a constitution whereby a support member is mounted on an outer periphery of the inner pipe joint portion, a plurality of projecting portions are provided on an outer periphery of the support member, and the outer pipe joint portion is supported in a state of point contact or line contact by the plurality of projecting portions may be employed.

According to this constitution, the support member having the plurality of projecting portions on its outer periphery is mounted on the outer periphery of the inner pipe joint portion, and therefore the outer pipe joint portion can be supported in a state of point contact or line contact easily.

In a sixteenth configuration pertaining to the first configuration, the joint constitutes a valve unit for controlling a fluid flowing through the inner pipe of the vacuum double pipe, the inner pipe joint portion constitutes a fluid passage portion connected to the inner pipe, through which fluid flowing in from the inner pipe flows, the valve unit includes a valve having a valve main body and a valve body for controlling the fluid flowing through the fluid passage portion, the outer pipe joint portion constitutes a valve case that covers the fluid passage portion and the valve main body and is connected to the outer pipe, the joint evacuation passage is formed by a space between the fluid passage portion and valve and the valve case, and the joint evacuation passage connects spaces between inner pipes and outer pipes of respective vacuum double pipes to each other, a midway part thereof between the respective vacuum double pipes being tightly closed.

According to this constitution, the fluid passage portion is connected to the inner pipe of the vacuum double pipe, and the fluid flowing through the fluid passage portion is controlled by the valve.

Here, the valve case covers the fluid passage portion and valve main body and is connected to the outer pipe of the vacuum double pipe. The joint evacuation passage is formed by the space between the fluid passage portion and valve and the valve case. The joint evacuation passage connects the spaces between the inner pipes and the outer pipes of the respective vacuum double pipes to each other, and the midway part thereof between the respective vacuum double pipes is tightly closed.

Hence, by evacuating the space between the inner pipe and the outer pipe of the vacuum double pipe to a vacuum, the joint evacuation passage communicating with this space, or in other words the space between the fluid passage portion and valve and the valve case, can be evacuated to a vacuum. As a result, thermal insulation between the fluid passage portion and valve and the valve case can be improved, and deterioration of the thermal insulation property of the vacuum double pipe in the valve unit part can be suppressed.

Further, the joint evacuation passage connects the spaces between the inner pipes and the outer pipes of the respective vacuum double pipes to each other, and therefore, by evacuating a single vacuum double pipe to a vacuum, a plurality of vacuum double pipes can be evacuated to a vacuum together through the joint evacuation passage. As a result, the labor required to evacuate the vacuum double pipe to a vacuum can be reduced.

Note that as long as the valve case covers the fluid passage portion and the valve main body, a part of the valve body, a valve body driving mechanism, and so on may be exposed to the exterior of the valve case. Further, the vacuum double pipe may be any vacuum double pipe that includes an outer pipe covering an inner pipe such that a vacuum is formed between the inner pipe and the outer pipe, for example a double pipe portion (an inner pipe joint portion for connecting flow passages of respective inner pipes to each other and an outer pipe joint portion that covers the inner pipe joint portion and connects respective outer pipes to each other, for example) of a joint for connecting double pipes to each other.

A seventeenth configuration is a vacuum double pipe having an inner pipe through which a fluid flows and an outer pipe covering the inner pipe such that a vacuum is established between the inner pipe and the outer pipe, wherein a plurality of node portions projecting in an annular shape outwardly in a radial direction are formed at intervals in at least one of the inner pipe and the outer pipe by bending a pipe wall thereof, an evacuation passage is formed by a space between the inner pipe and the outer pipe, and the evacuation passage is open at both end parts and tightly closed at a midway part in an extension direction of the inner pipe According to this constitution, actions and effects conforming to the sixth configuration can be exhibited.

An eighteenth configuration is a joint for connecting respective vacuum double pipes, each having an outer pipe covering an inner pipe such that a vacuum is established between the inner pipe and the outer pipe, to each other, including: an inner pipe joint portion having inner pipe connecting portions that are connected to the respective inner pipes in order to connect flow passages of the respective inner pipes to each other, a midway part of the inner pipe joint portion between the inner pipe connecting portions being tightly closed; and an outer pipe joint portion that covers the inner pipe joint portion and includes outer pipe connecting portions that are connected to the respective outer pipes, wherein a joint evacuation passage is formed by a space between the inner pipe joint portion and the outer pipe joint portion, and the joint evacuation passage connects the respective spaces between the inner pipes and the outer pipes to each other, a midway part thereof between the outer pipe connecting portions being tightly closed.

According to this constitution, actions and effects conforming to the first configuration can be exhibited.

In a nineteenth configuration pertaining to the eighteenth configuration, the joint constitutes a valve unit for controlling a fluid flowing through the inner pipe of the vacuum double pipe, the inner pipe joint portion constitutes a fluid passage portion connected to the inner pipe, through which fluid flowing in from the inner pipe flows, the valve unit includes a valve having a valve main body and a valve body for controlling the fluid flowing through the fluid passage portion, the outer pipe joint portion constitutes a valve case that covers the fluid passage portion and the valve main body and is connected to the outer pipe, the joint evacuation passage is formed by a space between the fluid passage portion and valve and the valve case, and the joint evacuation passage connects the spaces between the inner pipes and the outer pipes of the respective vacuum double pipes to each other, a midway part thereof between the respective vacuum double pipes being tightly closed.

According to this constitution, actions and effects conforming to the sixteenth configuration can be exhibited.

The present invention is not limited to the above embodiment and may be implemented as follows, for example.

A connecting passage portion 73 not including the bellows portion 73a may be employed in the valve units 70A, 70B.

Figure 14:
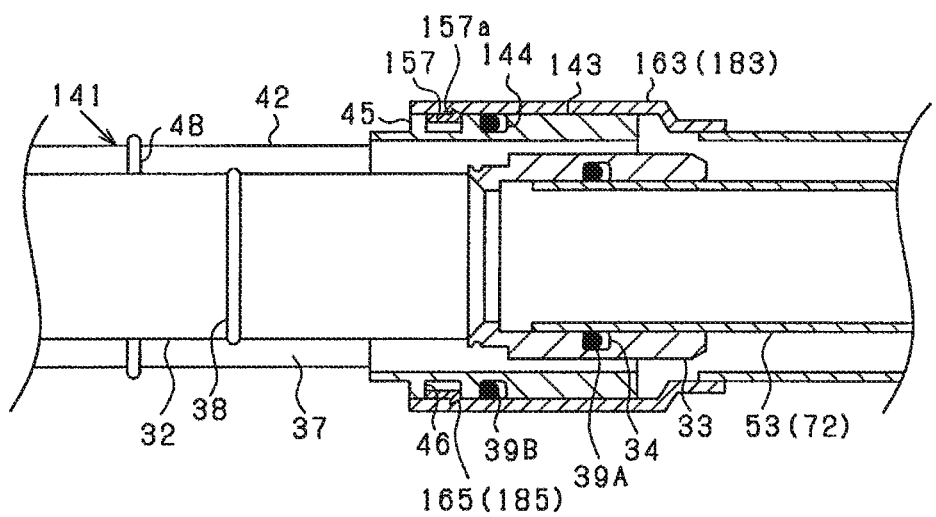
FIG. 14 is a sectional view showing a modified example of the connection state of the vacuum double pipe.

As shown in FIG. 14, an annular groove 144 may be provided in an outer surface of an end portion 143 of an outer pipe 141, and the O ring 39B may be fitted into this groove 144. In other words, as the outer pipe sealing structure, a seal may be formed by the O ring 39B between the end portion 143 of the outer pipe 141 and an outer pipe connecting portion 163 (183) in a radial direction of the outer pipe 141.

With this constitution, the outer pipe 141 and the outer pipe connecting portion 163 (183) can be positioned easily in an axial direction of the outer pipe 141. However, a superior sealing property is typically obtained when a seal is formed by the O ring 39B in the extension direction (the axial direction) of the outer pipe 141.

Further, a constitution in which an annular groove is provided in the outer surface of the inner pipe connecting portion 53 (the connecting portion of the second fluid passage portion 72) and the O ring 39A is fitted thereto or a constitution in which an annular groove is provided in an outer surface of the outer pipe connecting portion 163 (183) and the O ring 39B is fitted thereto may be employed.

As shown in the same drawing, an annular groove 165 (185) that has a triangular sectional shape and is provided in an inner surface of the outer pipe connecting portion 163 (183) and a latch ring 157 having an annular barb 157a that fits into the groove 165 may be employed as the outer pipe connectors.

With this constitution, the latch ring 157 is compressed in alignment with the groove 46 in the end portion 143 of the outer pipe 141, whereupon the end portion 143 of the outer pipe 141 is inserted into the outer pipe connecting portion 163 in the axial direction of the outer pipe 141. Then, when the barb 157a of the latch ring 157 reaches the groove 165 in the outer pipe connecting portion 163, the latch ring 157 is widened by its own elasticity and thereby fitted into the groove 165. As a result, the end portion 143 of the outer pipe 141 can be connected to the outer pipe connecting portion 163.

Figure 15:
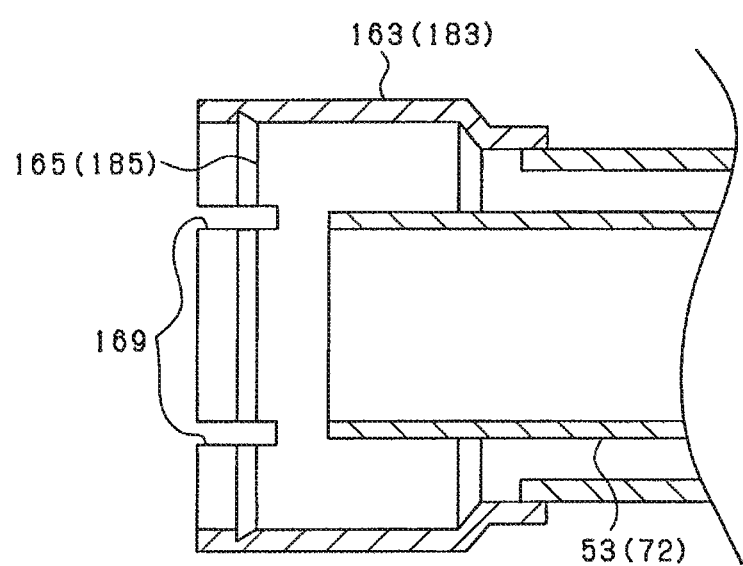
FIG. 15 is a sectional view showing a modified example of the manipulating portion.

A manipulating portion 169 shown in FIG. 15 may be employed effectively in the latch ring 157 and outer pipe connecting portion 163 (183) shown in FIG. 14. The manipulating portion 169 is a notch extending in the axial direction of the outer pipe connecting portion 163 from an end portion of the outer pipe connecting portion 163 to the groove 165 (185). The manipulating portion 169 is provided in a plurality at predetermined intervals in a circumferential direction of the outer pipe connecting portion 163.

With this constitution, the latch ring 157 is pressed in an inner diameter direction via the plurality of manipulating portions 169, whereby the latch ring 157 is compressed. When the latch ring 157 is compressed such that the barb 157a is removed from the groove 165, the outer pipe 141 and the outer pipe connecting portion 163 are pulled apart in the extension direction of the outer pipe 141. In so doing, the outer pipe 141 and the outer pipe connecting portion 163 can be disconnected.

Further, by increasing a width of the manipulating portion 169 in the circumferential direction of the outer pipe connecting portion 163, a fitting state between the barb of the latch ring 157 and the groove 165 of the outer pipe connecting portion 163 can be confirmed visually via the manipulating portion 169. In other words, the manipulating portion 169 can be provided with a function as a visual confirming portion for visually confirming that the end portion 143 of the outer pipe 141 and the outer pipe connecting portion 163 have been connected by the latch ring 157.

Note that an outer pipe connecting portion not including the manipulating portion 69 of the outer pipe connecting portion 63, 83 or the manipulating portion 169 of the outer pipe connecting portion 163, 183 may be employed. In other words, the outer pipe and the outer pipe connecting portion do not necessarily have to be detachable.

With regard to the support ring 35D shown in FIG. 4D and the support ring 35A shown in FIG. 4A, a constitution not having the groove 36d or a constitution in which the node portions 38 of the inner pipe 31 are provided near the two sides of the support ring in the extension direction (axial direction) of the inner pipe 31 may be employed. According to these constitutions, movement of the support ring in the extension direction of the inner pipe 31 can be suppressed by the node portions 38. Note that even when an interval between the node portions 38 sandwiching the support ring is wide, further movement of the support ring is suppressed at the point where the support ring comes into contact with the node portion 38.

Further, a projecting portion or an angle portion may be formed by causing a part of the inner pipe 31 and outer pipe 41 to project such that the inner pipe 31 and the outer pipe 41 are supported relative to each other in point contact or line contact by the projecting portion or the angle portion. Similarly, a projecting portion or an angle portion may be formed on the joint 50, 50U by causing a part of the inner pipe joint portion 51 and the outer pipe joint portion 61 to project such that the inner pipe joint portion 51 and the outer pipe joint portion 61 are supported relative to each other in point contact or line contact by the projecting portion or the angle portion. Furthermore, a projecting portion or an angle portion may be formed on the valve units 70A, 70B by causing a part of the valve main body 77 and the valve case 81 to project such that the valve main body 77 and the valve case 81 are supported relative to each other in point contact or line contact by the projecting portion or the angle portion.

The L shaped joint 50 shown in FIG. 5 may be made into an I shaped joint by making the inner pipe joint portion 51 and the outer pipe joint portion main body 62 rectilinear. In this case, it is effective to construct the inner pipe joint portion 51 and the outer pipe joint portion main body 62 to conform to the inner pipe main body 32 and the outer pipe main body 42 of the vacuum double pipe 30. In other words, the pipe walls of the inner pipe joint portion 51 and the outer pipe joint portion main body 62 should be made thinner than the pipe wall of a conventional vacuum double pipe, and similar node portions to the node portions 38, 48 should be provided singularly or in a plurality.

Further, the U shaped joint 50U shown in FIG. 6 may be made into an I shaped joint by making the inner pipe joint portion 51 and the outer pipe joint portion main body 62 rectilinear. Moreover, the I shaped joint may be made into a T shaped joint by making parts corresponding to the bellows portions 56, 66 into three-way passage portions. Note that the U shaped joint 50U may also be made into a Y shaped joint by making the parts corresponding to the bellows portions 56, 66 into three-way passage portions.

Furthermore, the U shaped joint 50U shown in FIG. 6 may be made into an L shaped joint by making the inner pipe joint portion 51 and the outer pipe joint portion main body 62 rectilinear and bending the bellows portions 56, 66 into an shape.

In this case, it is effective to form the inner pipe joint portion 51 integrally with the bellows portion 56 and to form the outer pipe joint portion main body 62 integrally with the bellows portion 66, similarly to the suction passage 19 shown in FIG. 13. It is also effective to provide similar node portions to the node portions 38, 48 on the inner pipe joint portion 51 and the outer pipe joint portion main body 62, respectively.

Further, by providing the suction passage 19 shown in FIG. 13 with an inner pipe that has a smaller diameter than the suction passage 19 but is constituted similarly to the suction passage 19, an L shaped vacuum double pipe can be formed. According to this constitution, the double pipe can be bent at the bellows portion, and therefore the bellows portion can be caused to function as a bend joint. Hence, a long double pipe can be formed integrally in a case where the double pipe is to be disposed in a bent state. As a result, the number of connecting portions in the double pipe can be reduced, enabling an improvement in a sealing property of the double pipe.

Figure 16:
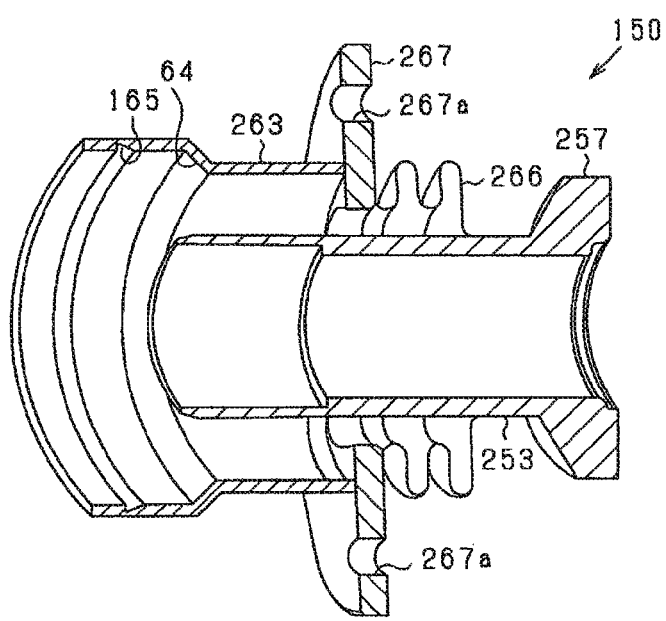
FIG. 16 is a sectional view showing a modified example of the joint.

As shown in FIG. 16, a joint 150 connected to the vacuum double pipe 30 may be constituted such that an inner pipe connecting portion 253 and an outer pipe connecting portion 263 are connected via a bellows portion 266 and a seal is formed between the inner pipe connecting portion 253 and the outer pipe connecting portion 263 by the bellows portion 266.

Here, a flange 267 is provided on the outer pipe connecting portion 263, and a bolt hole 267a is provided in the flange 267. Further, a flange 257 is provided in the inner pipe connecting portion 253. For example, the joint 150 is fixed by a bolt such that the outer pipe connecting portion 263 is disposed on an outer side of a casing of the supply unit 10 and the inner pipe connecting portion 253 is disposed on an inner side of the casing.

According to this constitution, the flange 257 of the inner pipe connecting portion 253 can be connected to a pipe of the Galden supply mechanism on the inner side of the casing, and the vacuum double pipe 30 can be connected to the outer pipe connecting portion 263 and the inner pipe connecting portion 253 on the outer side of the casing. As a result, the pipe of the Galden supply mechanism housed in the casing can be connected to the vacuum double pipe 30 easily.

Figure 17:
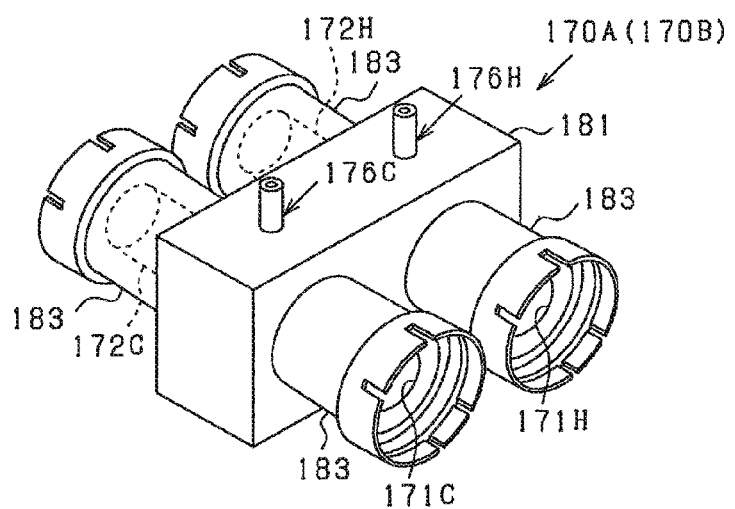
FIG. 17 is a perspective view showing a modified example of the valve unit.

In the above embodiment, the skewed first fluid passage portion 71H (71C) and second fluid passage portion 72 are connected via the valve 76H (76C). However, a first fluid passage portion 171H (171C) and a second fluid passage portion 172H (172C) disposed collinearly may be connected via a valve 176H (176C), as shown in FIG. 17. In this case, the high temperature Galden and the low temperature Galden are respectively switched between a flowing state and a blocked state independently by the high temperature side valve 176H and the low temperature side valve 176C.

Further, as shown in the same drawing, it is effective to employ a constitution whereby a set including the high temperature side first fluid passage portion 171H, the second fluid passage portion, and the main body of the valve 176H and a set including the low temperature side first fluid passage portion 171C, the second fluid passage portion, and the main body of the valve 176C are covered by the valve case 181 in the constitution described above. According to this constitution, an overall size of a valve unit 170A (170B) including the plurality of sets of fluid passage portions and valves can be reduced while suppressing a reduction in thermal insulation between the plurality of sets.

Furthermore, in this constitution, it is effective to employ a constitution whereby evacuation passages are formed by spaces between the valve case 181 and the first fluid passage portion 171H, 171C, second fluid passage portions, and valves 176H, 176C, the evacuation passages connect the spaces (evacuation passages 37) between the inner pipes 31 and the outer pipes 41 of the respective vacuum double pipes 30 to each other, and a midway part between the respective vacuum double pipes 30 is tightly closed. In so doing, the evacuation passages 37 of the vacuum double pipes 30 can be evacuated to a vacuum, and as a result, the aforesaid evacuation passages communicating with the evacuation passages 37 can be evacuated to a vacuum.

Figure 18:
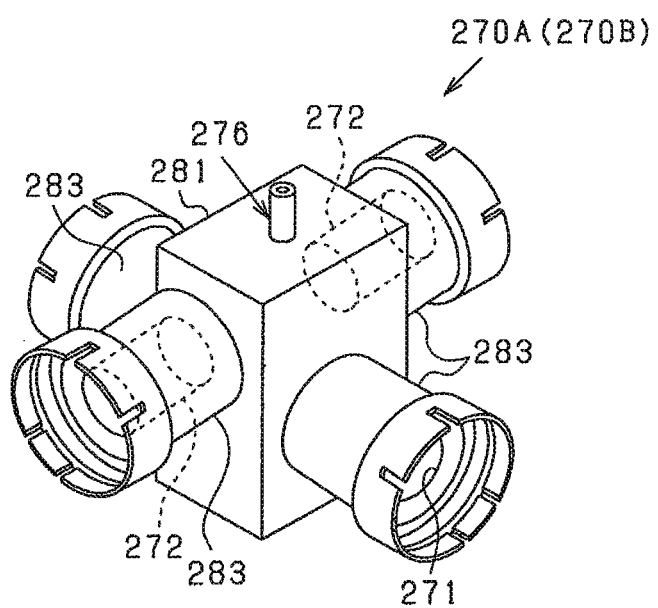
FIG. 18 is a perspective view showing another modified example of the valve unit.

As shown in FIG. 18, a valve unit 270A (270B) may include a first fluid passage portion 271 and a second fluid passage portion 272 in skewed positions, wherein the first fluid passage portion 271 and the second fluid passage portion 272 are connected via a valve 276. Further, one set of the fluid passage portions 271, 272 and a main body of the valve 276 may be covered by a single valve case 281. With this constitution also, evacuation passages formed by spaces between the valve case 281 and the first fluid passage portion 271, second fluid passage portion 272, and valve 276 can be evacuated to a vacuum.

Figure 19:
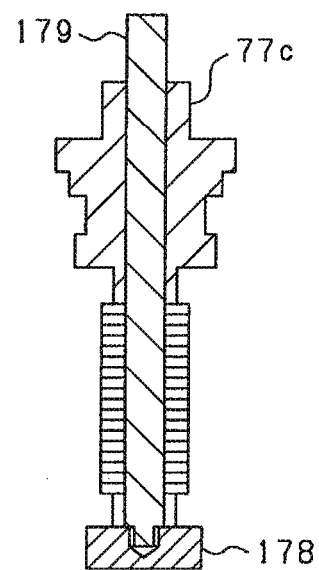
FIG. 19 is a partial sectional view showing another modified example of the valve unit.

FIG. 19 shows a part of the valve 76H (76C) of the valve unit 70A (70B). Here, a shaft member 179 (a thermal insulation member) formed from an adiabatic material (a PEEK material or the like, for example) may be connected to a valve body 178, and the shaft member 179 may be connected to a piston (a driving member) of the driving portion 76a described above. In other words, the valve body 178 and the piston may be connected via the shaft member 179. The shaft member 179 is formed in a rectilinear shape, and end portions thereof are screwed to the valve body 178 and the piston, respectively. The shaft member 179 is supported to be capable of sliding by the guide portion 77c. Note that a PEEK material exhibits superior thermal resistance and chemical resistance and is therefore effective when used as the shaft member of the valve 76H (76C).

According to this constitution, a driving force is exerted on the valve body 178 from the piston, and therefore a communication portion between the first main body passage 77a and the second main body passage 77b can be switched between a communicative state and a blocked state by driving the valve body 178. Here, the valve body 178 and the piston are connected via the shaft member 179 formed from an adiabatic material, and therefore thermal conduction between the valve body 178 and the piston can be suppressed. As a result, the thermal insulation property of the valve unit 70A (70B) can be improved.

Figure 20:
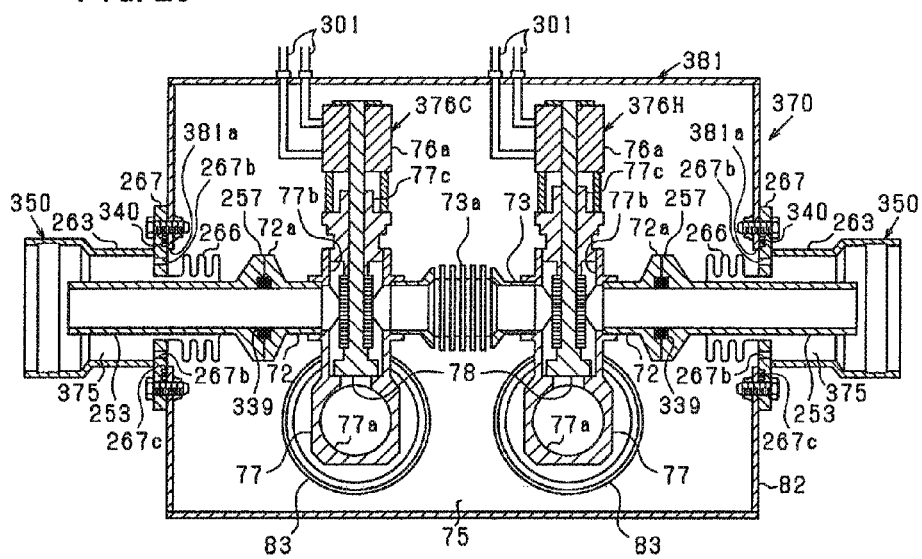
FIG. 20 is a sectional view showing another modified example of the valve unit.

As shown in FIG. 20, the driving portion 76a including the cylinder and the piston may be covered by a valve case 381 in addition to the valve main body 77, the first fluid passage portion 71H (71C), the second fluid passage portion 72, and the connecting passage portion 73. In this case, an air pipe 301 for introducing compressed air into the cylinder is led into the interior of the valve case 381 from the outside and connected to the driving portion 76a. A seal is then formed between the valve case 381 and the air pipe 301 by a sealing member or the like.

Further, a joint 350 conforming to the joint 150 shown in FIG. 16 is connected to the valve case 381. The flange 257 of the joint 350 is connected to the flange 72a provided on the end portion of the second fluid passage portion 72, and a seal is formed therebetween by a sealing member 339. Here, a plurality of through holes 267b and a groove 267c for accommodating a sealing member 340 are provided in the flange 267 of the joint 350 in addition to the constitution of the joint 150. The through holes 267b are provided in a plurality (eight, for example) at equal intervals in a circumferential direction of the flange 267, and penetrate a part between the inner pipe connecting portion 253 and the outer pipe connecting portion 263. The groove 267c is formed in an annular shape on the periphery of the through hole 267b and accommodates the sealing member 340. A part of the flange 267 on the outside of the groove 267c is fastened to the valve case 381 by a bolt and a nut, and a seal is formed between the flange 267 and the valve case 381 by the sealing member 340. At this time, opening portions 381a of the valve case 381 are disposed to overlap the plurality of through holes 267b. With this constitution, the vacuum double pipe 30 described above is connected to the joint 350.

In other words, a valve unit 370 and the vacuum double pipe 30 are connected via the joint 350, and the evacuation passage 75 of the valve unit 370 is connected to the space between the inner pipe 31 and the outer pipe 41 of the vacuum double pipe 30 by an evacuation passage 375 including the through holes 267b of the joint 350. In this case also, the valve unit 370, the joint 350, and the vacuum double pipe 30 can be evacuated to a vacuum together. Further, the flange 72a on the end portion of the second fluid passage portion 72 is connected to the flange 257 of the joint 350, and therefore the connecting portion of the valve 376H (376C) can be provided with a general-purpose constitution. As a result, in the valve unit 370 for the vacuum double pipe 30, the connection between the second fluid passage portion 72 (the fluid passage portion) and the joint 350, and accordingly the connection between the second fluid passage portion 72 and the vacuum double pipe 30, can be simplified.

Figure 21:
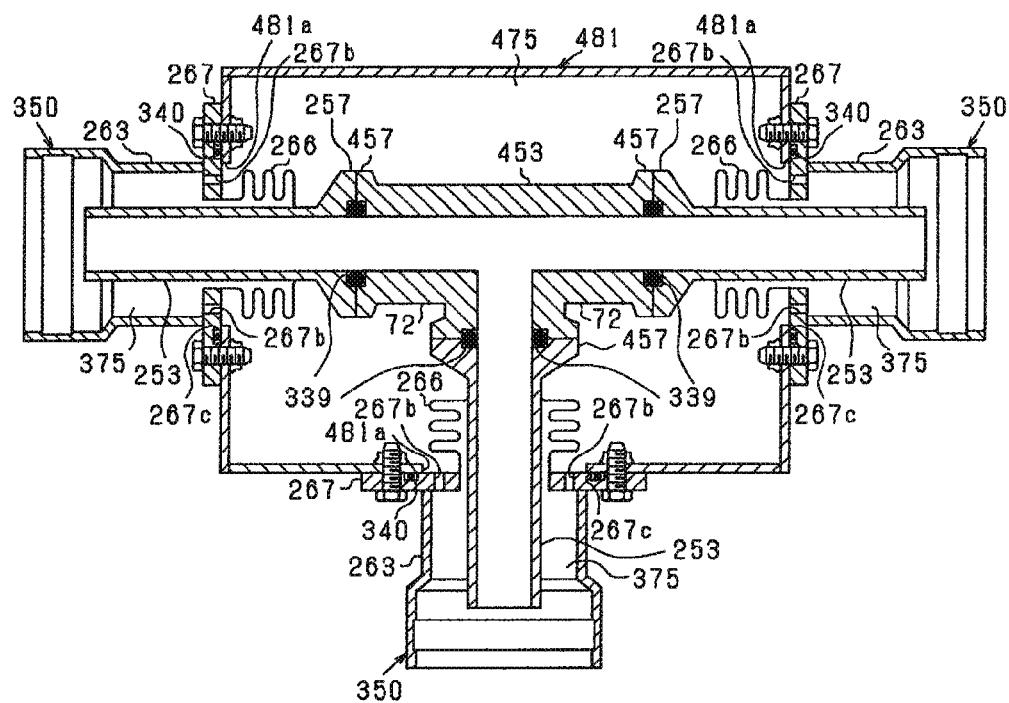
FIG. 21 is a sectional view showing another modified example of the joint.

As shown in FIG. 21, the inner pipe connecting portions 253 of the plurality of joints 350 may be connected to each other by a joint connecting passage portion 453, and the outer pipe connecting portions 263 of the plurality of joints 350 may be connected to each other by a joint case 481 covering the joint connecting passage portion 453. Here, the joint connecting passage portion 453 is formed in a "T" shape (a three-pronged shape), and a Galden flow passage is formed in the interior thereof. Further, an evacuation passage 475 may be formed by a space between the joint connecting passage portion 453 and the joint case 481, and the evacuation passage 475 may connect the evacuation passages 375 of the plurality of joints 350 to each other while a midway part thereof between the joints 350 is tightly closed. The vacuum double pipe 30 described above is connected to each joint 350. The joints 350 are connected to the joint case 481 in a similar manner to the valve case 381 shown in FIG. 20, and similarly to the joint 350, a flange 457 is provided on a connecting portion of the joint connecting passage portion 453 with the inner pipe connecting portion 253. As a result, the connecting portion of the joint connecting passage portion 453 can be provided with a general-purpose constitution.

Likewise with this constitution, the joint case 481, the joint 350, and the vacuum double pipe 30 can be evacuated to a vacuum together. More specifically, if the plurality of joints 350, the joint connecting passage portion 453, and the joint case 481 are considered together as a single joint, the inner pipe connecting portion 253 of the joint 350 and the joint connecting passage portion 453 correspond to the inner pipe joint portion, while the outer pipe connecting portion 263 of the joint 350 and the joint case 481 correspond to the outer pipe joint portion. By modifying the number of joints 350 and forming the joint case 481 accordingly at this time, the joint for connecting the vacuum double pipes 30 to each other can be designed freely.

The vacuum double pipe 30, the joints 50, 50U, the valve case 81 for the valve units 70A, 70B, and the connecting portions 71H, 71C, 72, 73 may be formed from a material such as a titanium or aluminum alloy.

In the above embodiment, pneumatic valves 76H, 76C are employed, but solenoid valves or the like may be employed instead.

In the above embodiment, the node portions 38, 48 are provided respectively on both the inner pipe 31 and the outer pipe 41. However, a constitution in which the node portions 38 are provided only on the inner pipe 31 or a constitution in which the node portions 48 are provided only on the outer pipe 41 may be employed.

The heating medium is not limited to Galden, and a liquid such as water or oil may be used instead. Further, a gas may be used as the heating medium.

Furthermore, the vacuum double pipe 30, the joints 50, 50U, the valve units 70A, 70B, and the modified examples thereof are not limited to application to a temperature control system and may be applied to a fluid supply system or a fluid discharge system.

The vacuum may be any state in which the pressure is lower than atmospheric pressure, and the degree of vacuum may be modified in accordance with the environment in which the temperature control system is used.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A connected structure of vacuum double pipes, comprising:
   a plurality of vacuum double pipes, each of the plurality of vacuum double pipes including an inner pipe having a flow passage for flowing a fluid, and an outer pipe covering the inner pipe to form a vacuum passage between the inner pipe and the outer pipe, the vacuum passage being open at both ends in an extension direction of the inner pipe and sealed between the both ends; and a joint configured to connect the plurality of vacuum double pipes, wherein the joint includes:

an inner pipe joint portion having inner pipe connectors, each of the inner pipe connectors being connected to corresponding one of the inner pipes so as to connect the flow passage, the inner pipe joint portion being sealed between the inner pipe connectors; and an outer pipe joint portion having outer pipe connectors, each of the outer pipe connectors being connected to corresponding one of the outer pipes, the outer pipe joint portion covering the inner pipe joint portion to form a joint evacuation passage between the inner pipe joint portion and the outer pipe joint portion, the joint evacuation passage connecting the vacuum passages of the vacuum double pipes and is sealed between the outer pipe connectors, wherein the double vacuum pipes include:

a plurality of nodes formed on the inner pipe by bending a pipe wall of the inner pipe with intervals, each node having an annular shape and projecting outwardly in a radial direction; and a support member mounted on an outer periphery of the inner pipe, the support member having a plurality of projecting portions provided on an outer periphery thereof, and a groove formed on an inner surface thereof, the support member being mounted on the outer periphery of the inner pipe by fitting one of the nodes into the groove, and wherein the outer pipe is supported by the plurality of projecting portions in a state of point contact or line contact.

2. The connected structure of vacuum double pipes according to claim 1, further comprising:

an inner pipe sealing structure configured to form a seal between the inner pipe and the inner pipe connector in a radial direction of the inner pipe;

an outer pipe sealing structure configured to form a seal between the outer pipe and the outer pipe connector; and an outer pipe connecting structure configured to connect the outer pipe and the outer pipe connector detachably.

3. The connected structure of vacuum double pipes according to claim 2, wherein the outer pipe sealing structure includes an outer pipe sealing member that forms the seal between the outer pipe and the outer pipe connector in an extension direction of the outer pipe, and the outer pipe connecting structure maintains a connection between the outer pipe and the outer pipe connector in a state where the outer pipe sealing member is deformed by a predetermined amount.

4. The connected structure of vacuum double pipes according to claim 2, wherein the outer pipe connecting structure includes a manipulator configured to manipulate the outer pipe connecting structure to disconnect the outer pipe and the outer pipe connector.

5. The connected structure of vacuum double pipes according to claim 4, wherein the manipulator includes a visual confirmation unit configured to enable visual confirmation for a connection of the outer pipe and the outer pipe connector by the outer pipe connecting structure.

6. The connected structure of vacuum double pipes according to claim 1, further comprising:

a bellows portion formed in the inner pipe, the bellows portion including a plurality of nodes continuously formed at intervals.

7. The connected structure of vacuum double pipes according to claim 1, wherein the inner pipe joint portion and the outer pipe joint portion support each other in a state of point contact or line contact.

8. The connected structure of vacuum double pipes according to claim 1, further comprising:

a joint support member mounted on an outer periphery of the inner pipe joint portion; and a plurality of projecting portions provided on an outer periphery of the joint support member, wherein the outer pipe joint portion is supported in a state of point contact or line contact by the plurality of projecting portions.

9. The connected structure of vacuum double pipes according to claim 1, wherein the joint forms a valve unit for controlling a fluid flowing through the inner pipe of the vacuum double pipe, the inner pipe joint portion forms a fluid passage connected to the inner pipe, the fluid passage allowing a fluid from the inner pipe to flow therethrough, the valve unit includes a valve having a valve main body and a valve body for controlling the fluid flowing through the fluid passage, the outer pipe joint portion forms a valve case that covers the fluid passage and the valve main body and is connected to the outer pipe, the joint evacuation passage is formed by a space between the fluid passage portion and valve and the valve case, and the joint evacuation passage connects spaces between the inner pipe and the outer pipe of the vacuum double pipes, the joint evacuation passage being sealed between the vacuum double pipes.

10. A connected structure of vacuum double pipes, comprising:

a plurality of vacuum double pipes, each of the plurality of vacuum double pipes including an inner pipe having a flow passage for flowing a fluid, and an outer pipe covering the inner pipe to form a vacuum passage between the inner pipe and the outer pipe, the vacuum passage being open at both ends in an extension direction of the inner pipe and sealed between the both ends; and a joint configured to connect the plurality of vacuum double pipes, the joint including:

an inner pipe joint portion having inner pipe connectors, each of the inner pipe connectors being connected to corresponding one of the inner pipes so as to connect the flow passage, the inner pipe joint portion being sealed between the inner pipe connectors; and an outer pipe joint portion having outer pipe connectors, each of the outer pipe connectors being connected to corresponding one of the outer pipes, the outer pipe joint portion forming a joint evacuation passage between the inner pipe joint portion and the outer pipe joint portion, the joint evacuation passage connecting the vacuum passages of the vacuum double pipes and being sealed between the outer pipe connectors, wherein the outer pipe is connected to the outer pipe connector by being inserting into the outer pipe connector, the outer pipe having a first groove formed on an outer surface thereof, and the outer pipe connector having a second groove formed on an inner surface thereof at a position to be aligned with a position of the first groove when the outer pipe is inserted to a connection position, the connected structure of vacuum double pipes further comprising:
an inner pipe sealing structure configured to form a seal between the inner pipe and the inner pipe connector in a radial direction of the inner pipe;
an outer pipe sealing structure including an outer pipe sealing member configured to form a seal between the outer pipe and the outer pipe connector in an extension direction of the outer pipe; and
an outer pipe connecting structure configured to connect the outer pipe and the outer pipe connector detachably, the outer pipe connecting structure maintaining a connection between the outer pipe and the outer pipe connector in a state where the outer pipe sealing member is deformed by a predetermined amount, the outer pipe connecting structure including a latch ring which is elastically deformable, the latch ring allowing the outer pipe to be inserted through the outer pipe connector by being compressed to have a reduced diameter so as to engage with the first groove only, and connecting the outer pipe and the outer pipe connector at the connection position by widening to have an enlarged diameter so as to engage with both of the first groove and the second groove.

11. The connected structure of vacuum double pipes according to claim 10, wherein
the outer pipe connecting structure includes a manipulator configured to manipulate the outer pipe connecting structure to disconnect the outer pipe and the outer pipe connector.

12. The connected structure of vacuum double pipes according to claim 11, wherein
the manipulator includes a visual confirmation unit configured to enable visual confirmation for a connection of the outer pipe and the outer pipe connector by the outer pipe connecting structure.

13. The connected structure of vacuum double pipes according to claim 10, wherein the double vacuum pipes include:
a plurality of nodes formed on at least one of the inner pipe and the outer pipe by bending a pipe wall of the at least one of the inner pipe and the outer pipe with intervals, each node having an annular shape and projecting outwardly in a radial direction.

14. The connected structure of vacuum double pipes according to claim 13, wherein the plurality of nodes are formed on the outer pipe.

15. The connected structure of vacuum double pipes according to claim 13, wherein the plurality of nodes are formed on the inner pipe.

16. The connected structure of vacuum double pipes according to claim 13, wherein the plurality of nodes are formed on both of the inner pipe and the outer pipe.

17. The connected structure of vacuum double pipes according to claim 13, further comprising:
a bellows portion formed in at least one of the inner pipe and the outer pipe, the bellows portion including a plurality of nodes continuously formed at intervals on the at least one of the inner pipe and the outer pipe.

* * * * *